(12) United States Patent
Ikeda et al.

(10) Patent No.: US 11,916,097 B2
(45) Date of Patent: Feb. 27, 2024

(54) DISPLAY APPARATUS WITH DETECTION DEVICE

(71) Applicant: Japan Display Inc., Tokyo (JP)

(72) Inventors: Masanobu Ikeda, Tokyo (JP); Yasuhiro Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 473 days.

(21) Appl. No.: 17/158,283

(22) Filed: Jan. 26, 2021

(65) Prior Publication Data
US 2021/0175282 A1    Jun. 10, 2021

Related U.S. Application Data

(63) Continuation of application No. PCT/JP2019/026108, filed on Jul. 1, 2019.

(30) Foreign Application Priority Data

Jul. 27, 2018    (JP) .................. 2018-141609

(51) Int. Cl.
*H01L 27/15*    (2006.01)
*G06F 3/044*    (2006.01)
(Continued)

(52) U.S. Cl.
CPC .......... *H01L 27/156* (2013.01); *G06F 3/0412* (2013.01); *G06F 3/0445* (2019.05);
(Continued)

(58) Field of Classification Search
CPC ..... H01L 27/156; H01L 33/38; H01L 33/405; H01L 33/62; H01L 25/167; G06F 3/0412;
(Continued)

(56) References Cited

U.S. PATENT DOCUMENTS

2004/0061688 A1    4/2004 Nakayama et al.
2015/0097181 A1*   4/2015 Yamazaki ......... H01L 29/78648
                                                    257/43
(Continued)

FOREIGN PATENT DOCUMENTS

CN    107230434    10/2017
JP    2004118754 A    4/2004
(Continued)

OTHER PUBLICATIONS

Japanese Office Action dated Aug. 3, 2021 in corresponding Japanese Application No. 2020-532244.
(Continued)

*Primary Examiner* — Douglas W Owens
(74) *Attorney, Agent, or Firm* — K&L Gates LLP

(57) ABSTRACT

A display apparatus with a detection device comprising: a substrate having a first principal surface and a second principal surface opposite to the first principal surface; a plurality of inorganic light-emitting elements provided on the first principal surface in a display region of the substrate; a first electrode facing the first principal surface of the substrate with the inorganic light-emitting elements interposed between the first electrode and the first principal surface; a first planarizing layer provided between the substrate and the first electrode and covering at least a side surface of the inorganic light-emitting elements; and a second electrode facing the second principal surface of the substrate and configured to output a signal corresponding to a change in distance between the second electrode and the first electrode.

13 Claims, 18 Drawing Sheets

(51) Int. Cl.
*G06F 3/041* (2006.01)
*H01L 33/38* (2010.01)
*H01L 33/40* (2010.01)
*H01L 33/62* (2010.01)

(52) U.S. Cl.
CPC ............ H01L 33/38 (2013.01); H01L 33/405 (2013.01); H01L 33/62 (2013.01)

(58) Field of Classification Search
CPC ......... G06F 3/0445; G06F 2203/04105; G06F 3/04166; G06F 3/0446; G06F 3/0447; G06F 3/0448; G06F 9/30
See application file for complete search history.

(56) References Cited

U.S. PATENT DOCUMENTS

| | | |
|---|---|---|
| 2017/0213502 A1 | 7/2017 | Henry et al. |
| 2017/0269749 A1* | 9/2017 | Bok .................. G06F 3/0446 |
| 2017/0269773 A1 | 9/2017 | Suzuki |
| 2020/0126477 A1 | 4/2020 | Henry et al. |

FOREIGN PATENT DOCUMENTS

| | | |
|---|---|---|
| JP | 2009099498 A | 5/2009 |
| JP | 2017102913 A | 6/2017 |
| JP | 2017167694 A | 9/2017 |
| JP | 2017529557 A | 10/2017 |
| WO | 2018134957 A1 | 7/2018 |

OTHER PUBLICATIONS

International Search Report issued in Application No. PCT/JP2019/026108, dated Sep. 24, 2019.
Chinese Office Action dated Dec. 7, 2023 in corresponding Chinese Application No. 201980049898.2.

* cited by examiner

FIG.5
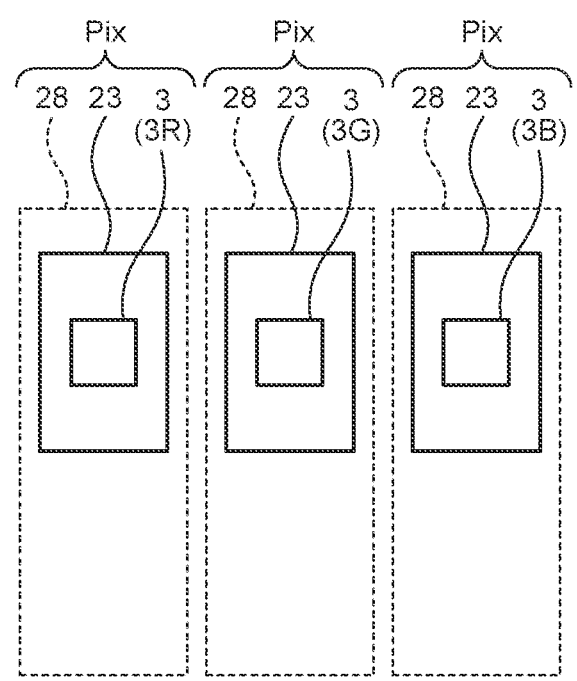
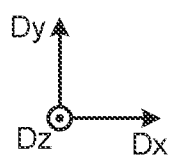

DISPLAY APPARATUS WITH DETECTION DEVICE

CROSS-REFERENCE TO RELATED APPLICATION

This application is a continuation of PCT international application Ser. No. PCT/2019/026108 filed on Jul. 1, 2019, which designates the United States, and which claims the benefit of priority from Japanese Patent Application No. 2018-141609 filed on Jul. 27, 2018, the entire contents of which are incorporated herein by reference.

BACKGROUND

1. Technical Field

The present disclosure relates to a display apparatus with a detection device.

2. Description of the Related Art

Inorganic electroluminescent (EL) displays provided with inorganic light-emitting diodes (micro LEDs) serving as display elements have recently been attracting attention (for example, refer to Japanese Translation of PCT International Application Publication No. 2017-529557). In inorganic EL displays, a plurality of light-emitting elements that output light in different colors are arrayed on an array substrate. Inorganic EL displays do not require any light source because they are provided with self-emitting elements and have higher light use efficiency because light is output without passing through a color filter. Inorganic EL displays have higher environmental resistance than organic EL displays provided with organic light-emitting diodes (OLEDs) serving as display elements.

Inorganic EL displays are expected to have a touch detection function for detecting contact or proximity of a finger or the like with or to an input surface and a force detection function for detecting force applied to the input surface, for example.

SUMMARY

A display apparatus with a detection device according to one aspect of the present disclosure comprising: a substrate having a first principal surface and a second principal surface opposite to the first principal surface; a plurality of inorganic light-emitting elements provided on the first principal surface in a display region of the substrate; a first electrode facing the first principal surface of the substrate with the inorganic light-emitting elements interposed between the first electrode and the first principal surface; a first planarizing layer provided between the substrate and the first electrode and covering at least a side surface of the inorganic light-emitting elements; and a second electrode facing the second principal surface of the substrate and configured to output a signal corresponding to a change in distance between the second electrode and the first electrode.

BRIEF DESCRIPTION OF THE DRAWINGS

FIG. 5 is a plan view of a plurality of pixels;

DETAILED DESCRIPTION

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described

First Embodiment

Figure 1:
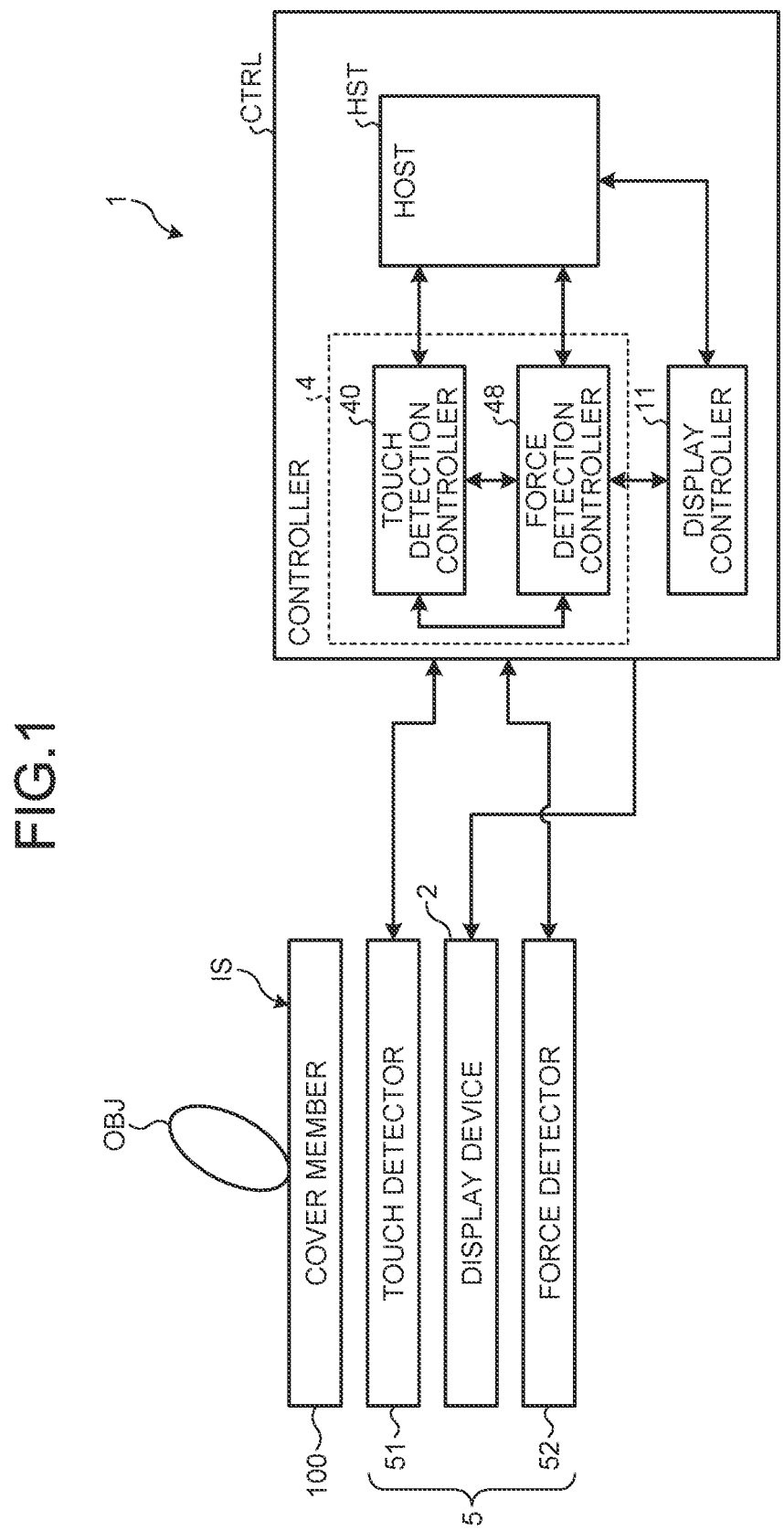
FIG. 1 is a block diagram of a configuration of a display apparatus with a detection device according to a first embodiment.

FIG. 1 is a block diagram of a configuration of a display apparatus with a detection device according to a first embodiment. As illustrated in FIG. 1, a display apparatus 1 with a detection device includes a display device 2, a detection device 5, and a controller CTRL.

The detection device 5 includes a touch detector 51 and a force detector 52. The force detector 52 is a device that shares at least part of a substrate or electrodes constituting the touch detector 51 and a substrate or electrodes constituting the display device 2.

The touch detector 51 detects contact or proximity of an object to be detected OBJ with or to an input surface IS of the display apparatus 1 with the detection device. The touch detector 51 outputs signals due to contact or proximity of the object to be detected OBJ with or to a region overlapping the input surface IS in the perpendicular direction to the controller CTRL. The input surface IS is a plane parallel to a sensor substrate 53 included in the detection device 5 and is the surface of a cover member 100, for example.

The object to be detected OBJ may be an object of a first type to be deformed in contact with the input surface IS or an object of a second type not to be deformed in contact with the input surface IS or less likely to be deformed than the object of the first type. While the object of the first type is a finger, for example, it is not limited thereto. While the object of the second type is a resin or metal stylus, for example, it is not limited thereto.

While the touch detector 51 is a capacitive or resistive sensor, for example, it is not limited thereto. Examples of the capacitive system include, but are not limited to, a mutual capacitive system, a self-capacitive system, etc.

The display device 2 displays images to the input surface IS. The display device 2 is a micro LED display device or a mini-LED display device including inorganic light-emitting diodes (LEDs) as display elements. The display element is a micro LED chip having a size of approximately 3 µm to 300 µm in planar view. The term "micro" of the micro LED is not intended to limit the size of the display element.

The force detector 52 detects force applied to the input surface IS by the object to be detected OBJ. Specifically, the force detector 52 outputs signals due to force applied to the input surface IS by the object to be detected OBJ to the controller CTRL. The force detector 52 is a capacitive sensor, for example.

The controller CTRL calculates a force signal value indicating force based on the signals output from the force detector 52. The controller CTRL includes a display controller 11, a detection controller 4, and a host HST. The detection controller 4 includes a touch detection controller 40 and a force detection controller 48.

The display controller 11 is an IC chip (e.g., a drive IC 200) mounted on a substrate of the display device 2, for example. The detection controller 4 is an IC chip mounted on a printed circuit board (e.g., a flexible printed circuit board) coupled to the sensor substrate 53, for example. The host HST is a central processing circuit (CPU), for example. The display controller 11, the detection controller 4, and the host HST cooperate to control the touch detector 51, the display device 2, and the force detector 52. The IC chip constituting the display controller 11 may be mounted on a printed circuit board coupled to the substrate of the display device 2, and the display controller 11 and the detection controller 4 may be incorporated in one IC chip.

The processing for calculating the force signal value may be performed by the display controller 11, the detection controller 4, or the host HST in the controller CTRL. Alternatively, two or more of the display controller 11, the detection controller 4, and the host HST may cooperate to perform the processing.

Figure 2:
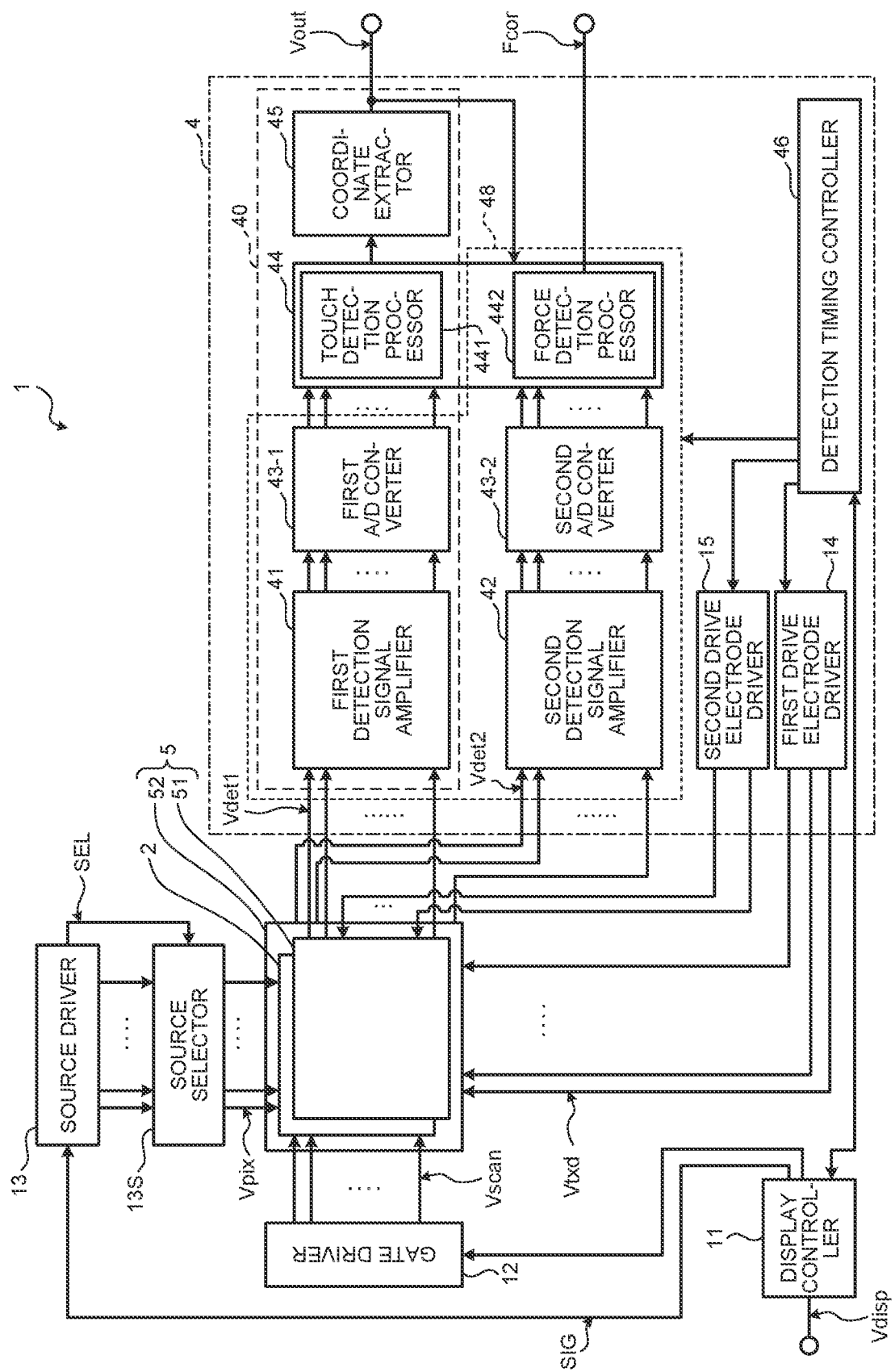
FIG. 2 is a block diagram of a configuration of a display device, the detection device, and a controller of the display apparatus with the detection device according to the first embodiment.

FIG. 2 is a block diagram of a configuration of the display device, the detection device, and the controller of the display apparatus with the detection device according to the first embodiment. As illustrated in FIG. 2, the controller CTRL includes the display controller 11, a gate driver 12, a source driver 13, a source selector 13S, and the detection controller 4. The display apparatus 1 with the detection device is a device in which the touch detector 51 is mounted on the display device 2. Part of the members, such as a substrate and electrodes, used as the display device 2 may also be used as part of the members, such as a substrate and electrodes, used as the touch detector 51. At least any one of the gate driver 12, the source driver 13, and the source selector 13S may be incorporated in the IC chip of the display controller 11 or provided on the substrate constituting the display device 2.

The display device 2 sequentially scans horizontal lines one by one to perform display based on scanning signals Vscan supplied from the gate driver 12. The display controller 11 is a circuit (control device) that controls the gate driver 12, the source driver 13, and the detection controller 4. The display controller 11 supplies control signals to the gate driver 12, the source driver 13, and the detection controller 4 based on video signals Vdisp supplied from the host HST. The display controller 11 generates image signals SIG to which pixel signals Vpix are time-division multiplexed from the video signals Vdisp of one horizontal line and supplies the image signals SIG to the source driver 13.

The gate driver 12 is a circuit that sequentially selects one horizontal line to be an object for display drive in the display device 2 based on the control signals supplied from the display controller 11. In other words, the gate driver 12 is a circuit that supplies the scanning signals Vscan to a gate line selected to be an object for display drive out of the gate lines included in the display device 2.

The source driver 13 is a circuit that supplies the pixel signals Vpix to respective pixels Pix of the display device 2 based on the control signals supplied from the display controller 11. The source driver 13 is supplied with 6-bit red (R), green (G), and blue (B) image signals SIG, for example.

The source driver 13 receives the image signals SIG from the display controller 11 and supplies them to the source selector 13S. The source driver 13 generates switch control signals SEL necessary to separate the pixel signals Vpix multiplexed to the image signals SIG and supplies the switch control signals SEL and the image signals SIG to the source selector 13S. The source selector 13S includes a plurality of switching elements. The source selector 13S receives the switch control signals SEL and the image signals SIG from the source driver 13, generates the pixel signals Vpix, and supplies them to the display device 2. With the source selector 13S, the number of wires between the source driver 13 and the display controller 11 can be reduced. The source selector 13S is not necessarily provided. In other words, the pixel signals Vpix may be directly supplied from the display controller 11 to the source driver 13. The display controller 11 may perform part of control on the source driver 13, and only the source selector 13S may be disposed.

The detection controller 4 includes a first drive electrode driver 14. The first drive electrode driver 14 is a circuit that supplies touch drive signals Vtxd to drive electrodes Tx of the detection device 5 based on control signals supplied from a detection timing controller 46. The touch drive signal Vtxd is an AC rectangular wave at a predetermined frequency (e.g., a frequency of the order of several kilohertz to several hundred kilohertz), for example. The AC waveform of the touch drive signal Vtxd may be a sine wave or a triangular wave. When the touch detection controller 40 performs a touch detection operation by the self-capacitive system, the first drive electrode driver 14 supplies the touch drive signals Vtxd to one of the drive electrodes Tx and detection electrodes Rx1.

The detection controller 4 includes a second drive electrode driver 15. The second drive electrode driver 15 is a circuit that supplies second drive signals Vd to at least one of the drive electrodes Tx and the detection electrodes Rx1 of the detection device 5 based on control signals supplied from the detection timing controller 46. When the force detection controller 48 performs a force detection operation by the self-capacitive system, the second drive electrode driver 15 may supply the second drive signals Vd to a second electrode Rx2.

The touch detector 51 sequentially scans detection blocks one by one to perform touch detection based on the touch drive signals Vtxd supplied from the first drive electrode driver 14. The touch detector 51 is a capacitive touch panel, for example. The touch detector 51 includes a first electrode 54 (the drive electrodes Tx and the detection electrodes Rx1 (refer to FIG. 7)). The touch detector 51 supplies touch detection signals Vdet1 corresponding to a change in capacitance between the drive electrodes Tx and the detection electrodes Rx1 caused by proximity or contact of an external object, such as a finger. The touch detector 51 performs both mutual capacitive touch detection and self-capacitive touch detection. Alternatively, the touch detector 51 may perform one of mutual capacitive touch detection and self-capacitive touch detection.

The force detector 52 performs mutual capacitive or self-capacitive force detection based on the second drive signals Vd supplied from the second drive electrode driver 15. The second electrode Rx2 (refer to FIG. 6) outputs force detection signals Vdet2.

The detection controller 4 detects whether a touch is made on the input surface IS based on the control signals supplied from the display controller 11 and the touch detection signals Vdet1 supplied from the touch detector 51. In the present specification, touch indicates a state where the object to be detected OBJ is in contact with or in proximity to the input surface IS. The detection controller 4 detects force applied to the input surface IS based on the force detection signals Vdet2 supplied from the force detector 52. The detection controller 4 is a circuit that calculates, when a touch is detected, the coordinates and the contact area of the touch in a touch detection region.

The detection controller 4 includes a first detection signal amplifier 41, a second detection signal amplifier 42, a first A/D converter 43-1, a second A/D converter 43-2, a signal processor 44, a coordinate extractor 45, and a detection timing controller 46. The signal processor 44 includes a touch detection processor 441 and a force detection processor 442. The first detection signal amplifier 41, the first A/D converter 43-1, the coordinate extractor 45, and the touch detection processor 441 constitute the touch detection controller 40. The first detection signal amplifier 41, the second detection signal amplifier 42, the first A/D converter 43-1, the second A/D converter 43-2, and the force detection processor 442 constitute the force detection controller 48.

The first detection signal amplifier 41 is an integrating circuit, for example, and amplifies the touch detection signals Vdet1 supplied from the touch detector 51. The first A/D converter 43-1 samples analog signals output from the first detection signal amplifier 41 to convert them into digital signals at a timing synchronized with the touch drive signals Vtxd.

The second detection signal amplifier 42 is an integrating circuit, for example, and amplifies the force detection signals Vdet2 supplied from the force detector 52. The second A/D converter 43-2 samples analog signals output from the second detection signal amplifier 42 to convert them into digital signals at a timing synchronized with the second drive signals Vd.

The signal processor 44 is a logic circuit that performs touch detection for detecting whether a touch is made on the input surface IS based on the output signals from the first A/D converter 43-1 and performs force detection for detecting force applied to the input surface IS based on the output signals from the second A/D converter 43-2. The signal processor 44 performs processing of extracting a signal (absolute value $|\Delta V|$) of the difference between the detection signals caused by a finger. The signal processor 44 compares the absolute value $|\Delta V|$ with a predetermined threshold voltage. If the absolute value $|\Delta V|$ is lower than the threshold voltage, the signal processor 44 determines that an object to be detected is in a non-contact state. By contrast, if the absolute value $|\Delta V|$ is equal to or higher than the threshold voltage, the signal processor 44 determines that an object to be detected is in a contact state or a proximity state. The signal processor 44 calculates force applied to the input surface IS based on the absolute value $|\Delta V|$. The signal processor 44 outputs the force applied to the input surface IS as a force detection value Fcor.

The coordinate extractor 45 is a logic circuit that calculates, when the signal processor 44 detects at least one of a touch and force applied to the input surface IS, the coordinates of the touch detection position on the input surface IS. The coordinate extractor 45 outputs the coordinates of the touch detection position as output signals Vout. The touch detection controller 40 does not necessarily include the coordinate extractor 45 and may output the touch detection signals Vdet1 as the output signals Vout without calculating the coordinates of the touch detection position. The touch detection controller 40 may output the output signals Vout to the display controller 11. The display controller 11 can perform a predetermined display or detection operation based on the output signals Vout.

The force detection controller 48 receives the output signals Vout output from the coordinate extractor 45. The force detection controller 48 may correct the force detection value Fcor using the output signals Vout output from the coordinate extractor 45.

Figure 3:
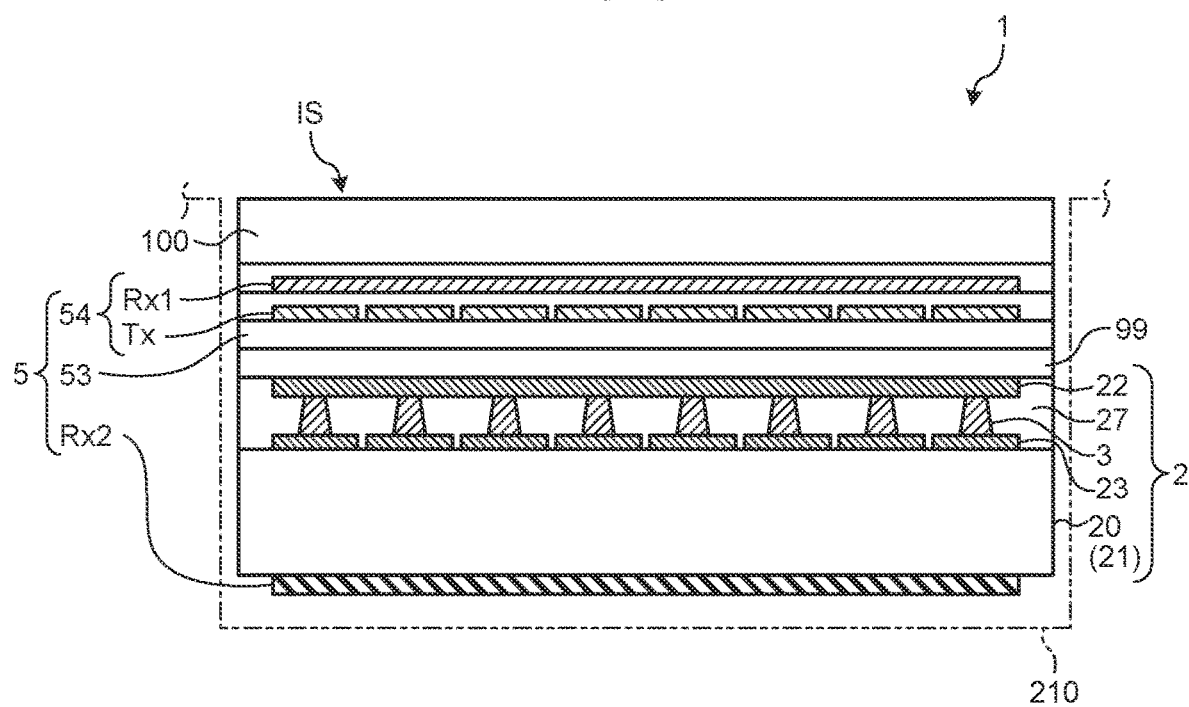
FIG. 3 is a sectional view of a schematic sectional structure of the display apparatus with the detection device according to the first embodiment.
Figure 4:
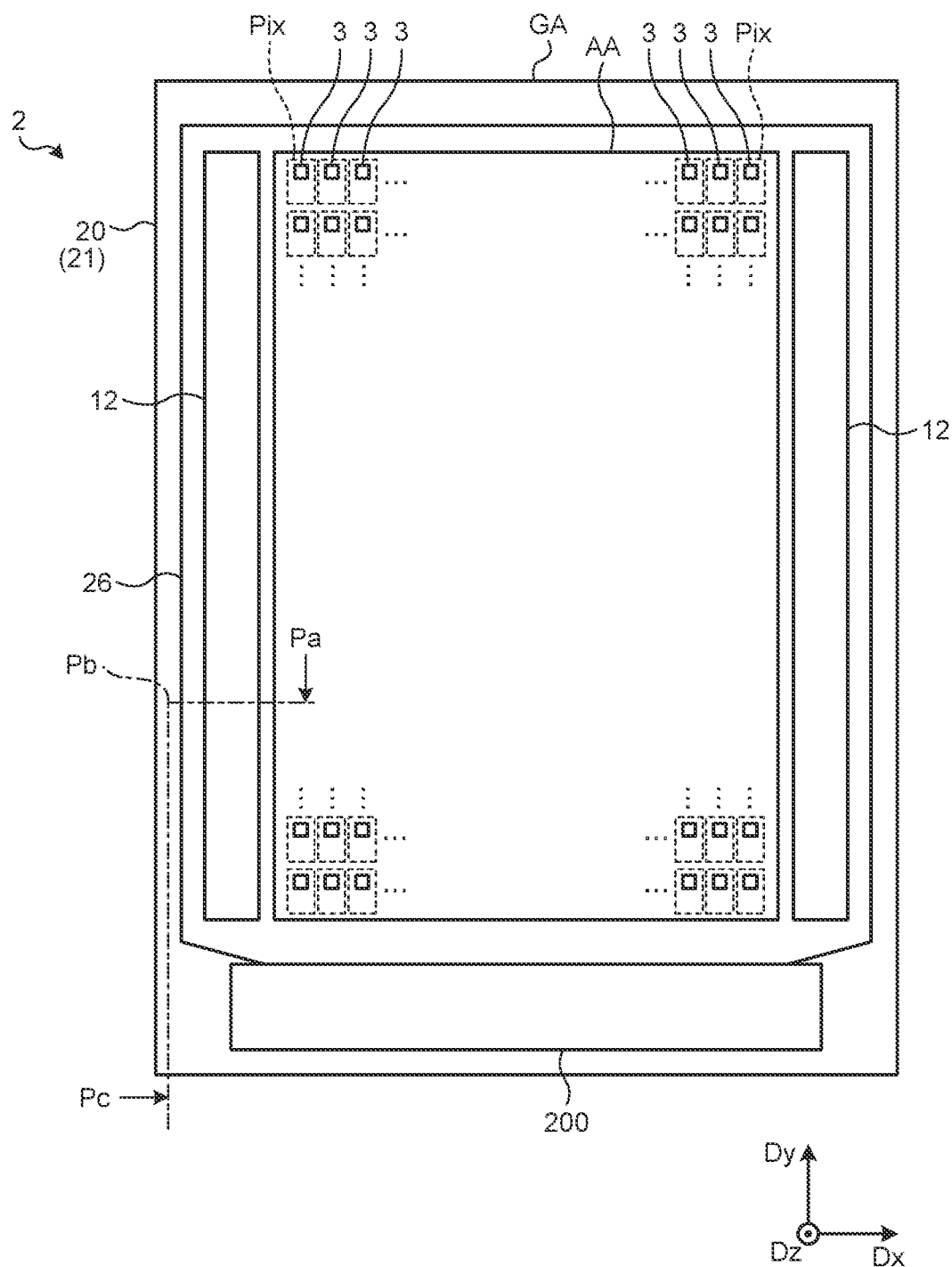
FIG. 4 is a plan view schematically illustrating the display device according to the first embodiment.
Figure 6:
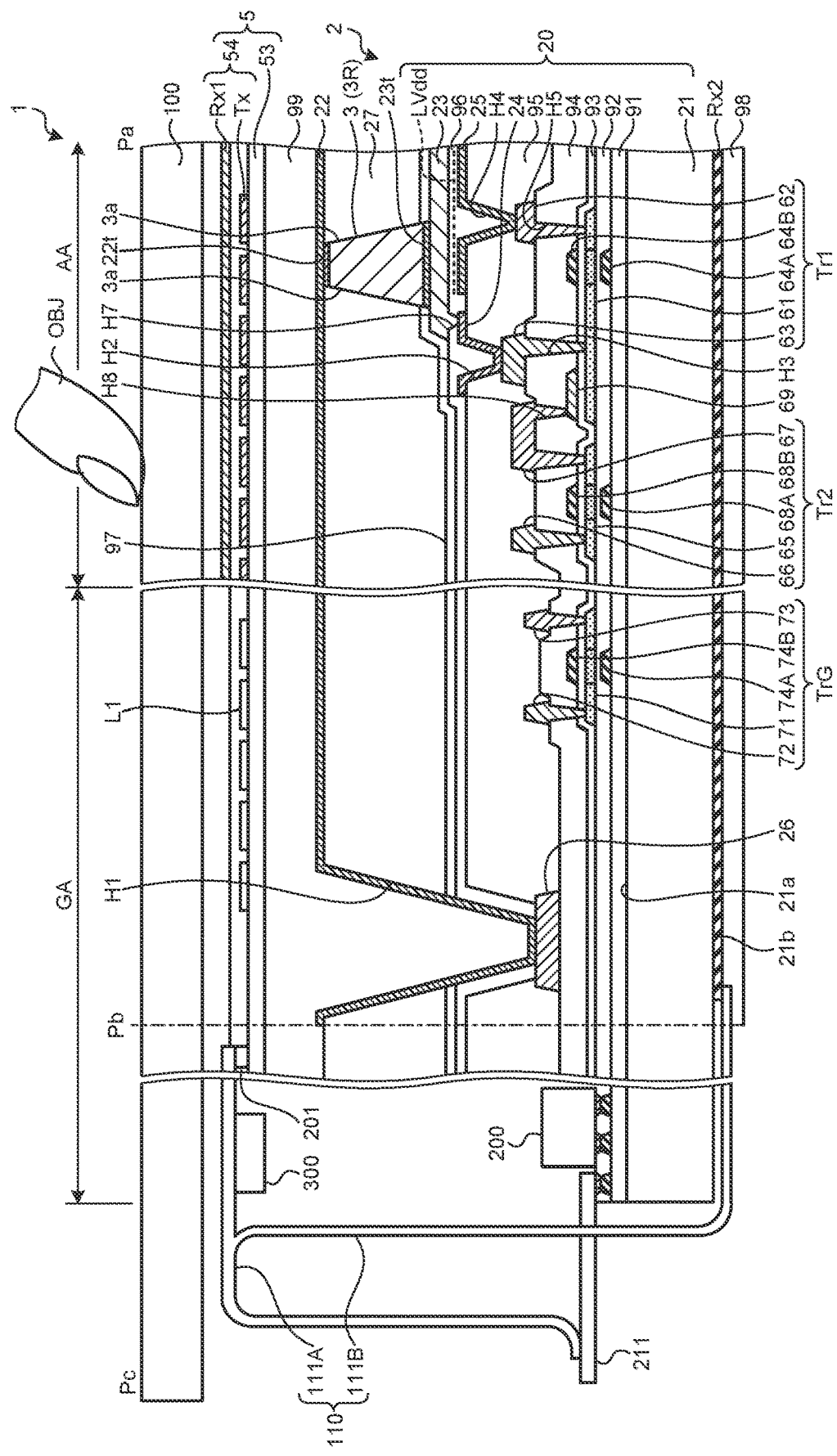
FIG. 6 is a sectional view along line Pa-Pb-Pc of FIG. 4.
Figure 7:
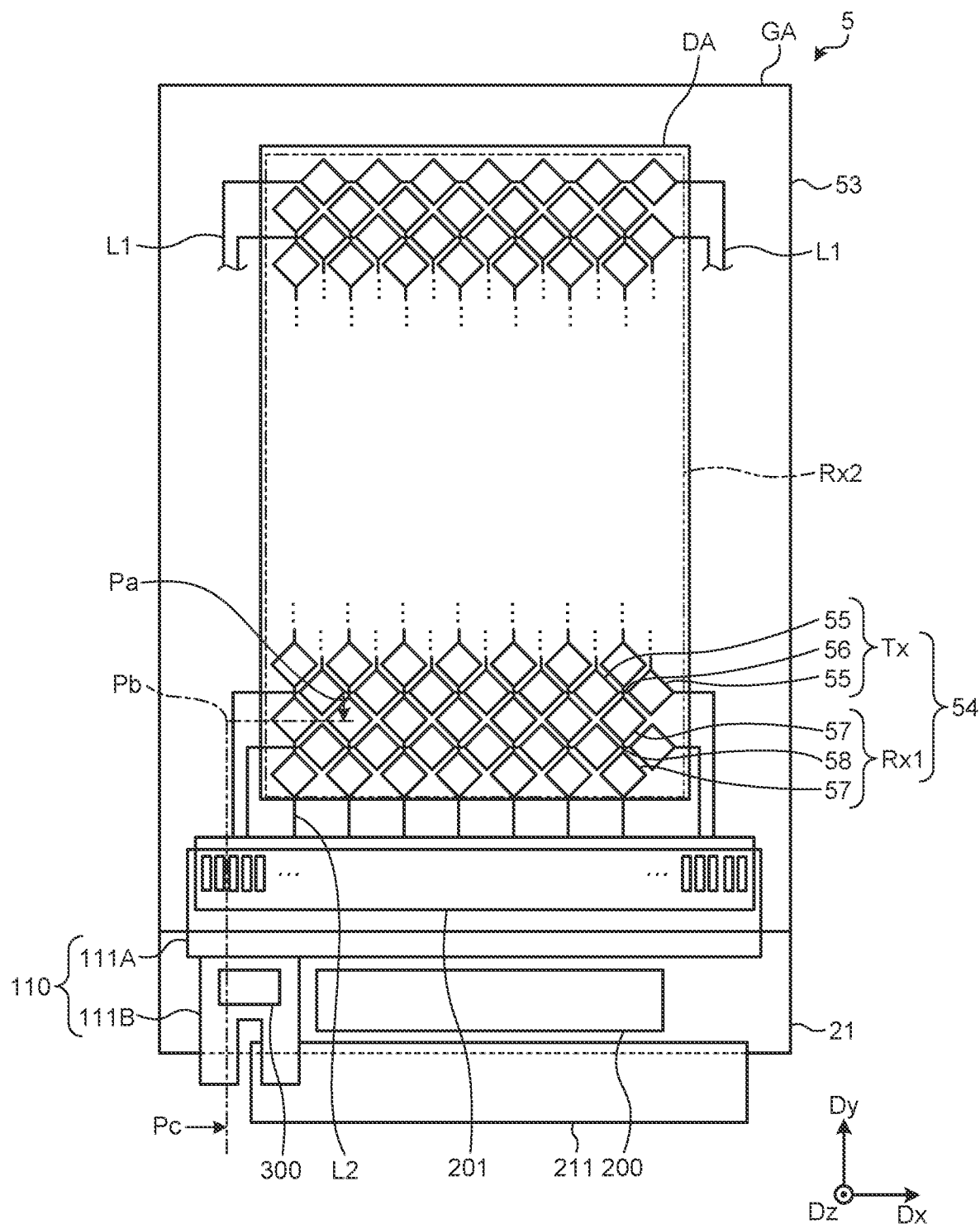
FIG. 7 is a plan view schematically illustrating the detection device according to the first embodiment.
Figure 8:
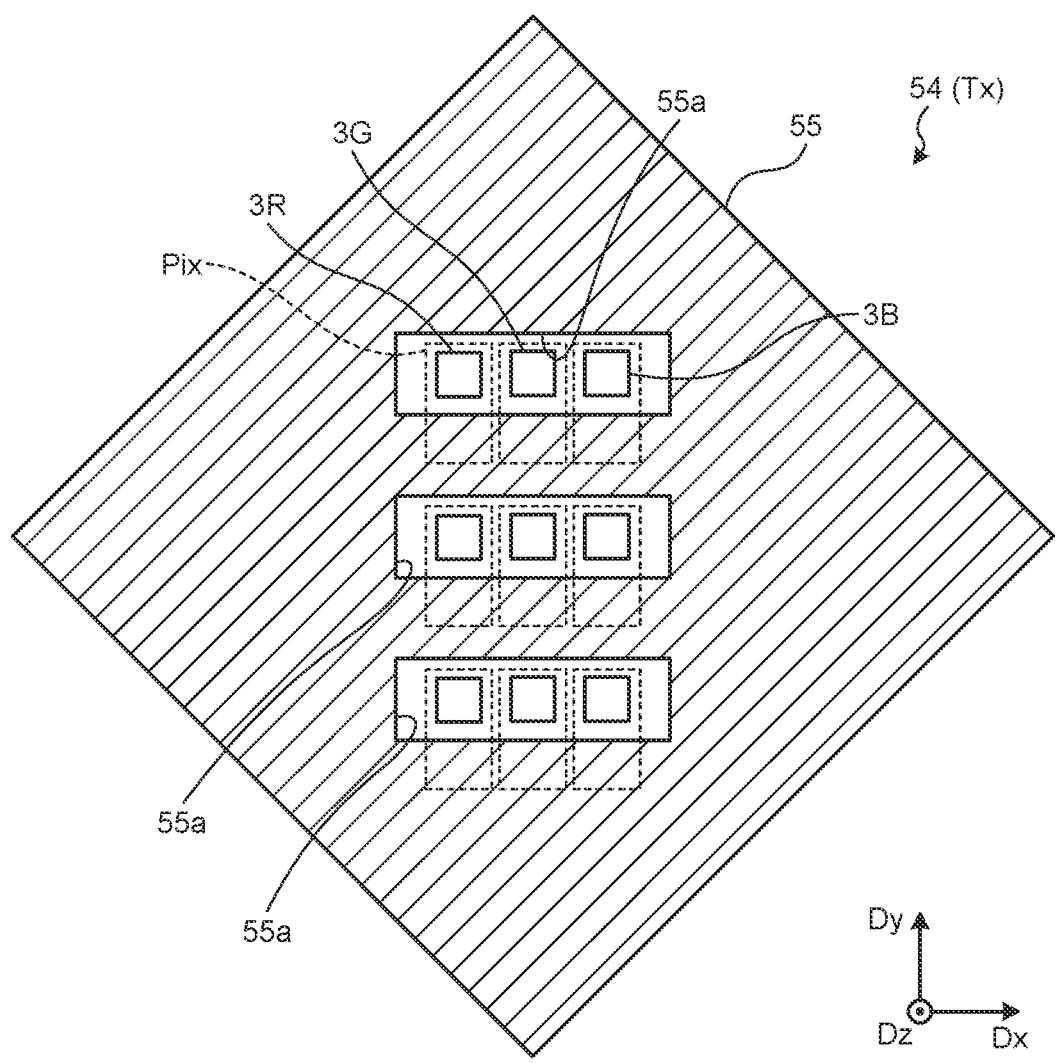
FIG. 8 is a plan view of a relation between a first electrode and light-emitting elements.

The following describes an exemplary configuration of the display apparatus 1 with the detection device according to the present embodiment in greater detail. FIG. 3 is a sectional view of a schematic sectional structure of the display apparatus with the detection device according to the first embodiment. FIG. 4 is a plan view schematically illustrating the display device according to the first embodiment. FIG. 5 is a plan view of a plurality of pixels. FIG. 6 is a sectional view along line Pa-Pb-Pc of FIG. 4. FIG. 7 is a plan view schematically illustrating the detection device according to the first embodiment. FIG. 8 is a plan view of a relation between the first electrode and light-emitting elements.

As illustrated in FIG. 3, the display device 2, the detection device 5, and the cover member 100 are layered in the display apparatus 1 with the detection device. The cover member 100 is provided on the outermost surface of the display apparatus 1 with the detection device covering the first electrode 54 and the sensor substrate 53 included in the detection device 5 and the display device 2. The upper surface of the cover member 100 serves as the input surface IS. The cover member 100 is a translucent glass or resin substrate, for example.

In the present specification, a direction from a substrate 21 of the display device 2 to the input surface IS in a direction perpendicular to the surface of the substrate 21 is referred to as an "upper side". A direction from the input surface IS to the substrate 21 is referred to as a "lower side". The "planar view" indicates a view seen from the direction perpendicular to the surface of the substrate 21.

A first direction Dx and a second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. In other words, the third direction Dz is the direction perpendicular to the surface of the substrate 21.

The display device 2 includes an array substrate 20, a plurality of light-emitting elements 3, and a first planarizing layer 27. The light-emitting elements 3 are provided on the array substrate 20. As illustrated in FIG. 4, the display device 2 includes the pixels Pix provided on the array substrate 20, and the pixels Pix are disposed in a matrix (row-column configuration) in a display region AA. The gate driver 12, a drive integrated circuit (IC) 200, and cathode wiring 26 are disposed on the array substrate 20. The array substrate 20 is a drive circuit board for driving the pixels Pix and is also called a backplane or an active matrix substrate. The array substrate 20 is provided with the substrate 21, first transistors Tr1, second transistors Tr2, gate line transistors TrG, and various kinds of wiring, for example. The first transistors Tr1, the second transistors Tr2, and other transistors are switching elements provided to the respective pixels Pix. The gate line transistors TrG are switching elements included in the gate driver 12.

As illustrated in FIG. 4, the display device 2 has a display region AA and a peripheral region GA. The display region AA is provided overlapping the pixels Pix and displays an image. The peripheral region GA does not overlap the pixels Pix and is disposed outside the display region AA.

The pixels Pix are arrayed in a first direction Dx and a second direction Dy in the display region AA of the substrate 21. The pixels Pix each include a light-emitting element 3. The display apparatus 1 displays an image by outputting light in different colors from the respective light-emitting elements 3.

The gate driver 12 drives a plurality of gate lines based on various control signals received from the drive IC 200. The gate driver 12 sequentially or simultaneously selects a plurality of gate lines and supply gate drive signals to the selected gate lines. As a result, the gate driver 12 selects a plurality of pixels Pix coupled to the gate lines.

The drive IC 200 is a circuit that controls display on the display device 2. In other words, the drive IC 200 functions as the display controller 11. The drive IC 200 may be mounted on the peripheral region GA of the substrate 21 by chip-on-glass (COG) bonding. The mounting form of the drive IC 200 is not limited thereto, and the drive IC 200 may be mounted on a flexible printed circuit board or a rigid substrate coupled to the peripheral region GA of the substrate 21 by chip-on-film (COF) bonding.

The cathode wiring 26 is provided in the peripheral region GA of the substrate 21. The cathode wiring 26 is provided surrounding the pixels Pix in the display region AA and the gate driver 12 in the peripheral region GA. In other words, the cathode wiring 26 is disposed between the outermost periphery of the substrate 21 and the gate driver 12. Cathodes of the light-emitting elements 3 are coupled to the common cathode wiring 26 and are supplied with a reference potential (e.g., a ground potential) from the cathode wiring 26. The cathode wiring 26 may have a slit at a part and be composed of two different wires on the substrate 21. While the cathode wiring 26 according to the present embodiment is coupled to the drive IC 200, the present embodiment is not limited thereto. The cathode wiring 26 may be supplied with the reference potential directly from a power-supply circuit disposed on a controller substrate coupled to the substrate 21 not via the drive IC 200.

As illustrated in FIG. 5, the pixels Pix each include the light-emitting element 3, a second coupling electrode 23, and a pixel circuit 28. The light-emitting elements 3 are provided corresponding to the respective pixels Pix and include first light-emitting elements 3R, second light-emitting elements 3G, and third light-emitting elements 3B that output light in different colors. The first light-emitting element 3R outputs red light. The second light-emitting element 3G outputs green light. The third light-emitting element 3B outputs blue light. In the following description, the first light-emitting element 3R, the second light-emitting element 3G, and the third light-emitting element 3B are simply referred to as the light-emitting elements 3 when they need not be distinguished from one another. The light-emitting elements 3 may output light in four or more different colors.

The pixel Pix including the first light-emitting element 3R, the pixel Pix including the second light-emitting element 3G, and the pixel Pix including the third light-emitting element 3B are repeatedly arrayed in this order in the first direction Dx. In other words, the first light-emitting element 3R, the second light-emitting element 3G, and the third light-emitting element 3B are repeatedly arrayed in this order in the first direction Dx. The first light-emitting elements 3R, the second light-emitting elements 3G, and the third light-emitting elements 3B are each arrayed in the second direction Dy. In other words, in the example illustrated in FIG. 5, the light-emitting elements 3 are each disposed side by side with other light-emitting elements 3 that output light in different colors in the first direction Dx. The light-emitting elements 3 are each disposed side by side with other light-emitting elements 3 that output light in the same color in the second direction Dy.

The positions of the pixels Pix are not limited to those in the example illustrated in FIG. 5. The pixel Pix including the second light-emitting element 3G and the pixel Pix including the third light-emitting element 3B, for example, may be disposed side by side in the second direction Dy. The two pixels Pix disposed side by side in the second direction Dy may be disposed side by side with one pixel Pix including the first light-emitting element 3R in the first direction Dx. In this case, the first light-emitting element 3R and the second light-emitting element 3G are disposed side by side in the first direction Dx, and the second light-emitting element 3G and the third light-emitting element 3B are disposed side by side in the second direction Dy. The first light-emitting element 3R may be disposed side by side with the third light-emitting element 3B in the first direction Dx.

As illustrated in FIG. 5, the second coupling electrode 23 has a larger area than the light-emitting element 3 when viewed from the direction perpendicular to the substrate 21 (hereinafter, referred to as the third direction Dz). In FIG. 5, the outer shape of the light-emitting element 3 corresponds to the outer shape of the lower surface. In other words, the second coupling electrode 23 has a larger area than the lower surface of the light-emitting element 3 when viewed from the third direction Dz. The second coupling electrode 23 is made of metal material that reflects light. The second coupling electrode 23 reflects, toward the input surface IS, light output from the light-emitting element 3, reflected by the surface of the first planarizing layer 27, or the cover member 100, for example, and traveling toward the array substrate 20. With this configuration, the display apparatus 1 with the detection device can increase the use efficiency of the light output from the light-emitting element 3. Examples of the material of the second coupling electrode 23 include, but are not limited to, aluminum (Al) or aluminum alloy material, copper (Cu) or copper alloy material, silver (Ag) or silver alloy material, etc.

The pixel circuit 28 illustrated in FIG. 5 is a drive circuit that drives the light-emitting element 3. The pixel circuit 28 includes the first transistor Tr1 and the second transistor Tr2 (refer to FIG. 6), for example, provided corresponding to the light-emitting element 3.

As illustrated in FIG. 6, the light-emitting element 3 is provided on the array substrate 20. The substrate 21 of the array substrate 20 has a first principal surface 21a and a second principal surface 21b opposite to the first principal surface 21a. The light-emitting element 3 is provided on the first principal surface 21a of the substrate 21. The substrate 21 is an insulating substrate and is a glass or resin substrate or a resin film, for example.

The first transistors Tr1 and the second transistors Tr2 are provided to the respective pixels Pix. The first transistor Tr1 and the second transistor Tr2 are thin-film transistors (TFTs) and are n-channel metal oxide semiconductor (MOS) TFTs in this example. The first transistor Tr1 includes a semiconductor 61, a source electrode 62, a drain electrode 63, a first gate electrode 64A, and a second gate electrode 64B. The first gate electrode 64A is provided on the substrate 21 with a first insulating layer 91 interposed therebetween. The first insulating layer 91 to a fourth insulating layer 94, a sixth insulating layer 96, and a seventh insulating layer 97 are made of inorganic insulating material, such as a silicon oxide film (SiO), a silicon nitride film (SiN), and a silicon oxynitride film (SiON). The inorganic insulating layers are not limited to single layers and may be multilayered films.

A second insulating layer 92 is provided on the first insulating layer 91 to cover the first gate electrode 64A. The semiconductor 61 is provided on the second insulating layer 92. A third insulating layer 93 is provided on the second insulating layer 92 to cover the semiconductor 61. The second gate electrode 64B is provided on the third insulating layer 93. The semiconductor 61 is provided between the first gate electrode 64A and the second gate electrode 64B in the direction perpendicular to the substrate 21. A channel region is formed at a part of the semiconductor 61 overlapping the first gate electrode 64A and the second gate electrode 64B.

In the example illustrated in FIG. 6, the first transistor Tr1 has what is called a dual-gate structure. The first transistor Tr1 may have a bottom-gate structure including the first gate electrode 64A and not including the second gate electrode 64B. Alternatively, the first transistor Tr1 may have a top-gate structure including the second gate electrode 64B alone and not including the first gate electrode 64A.

The semiconductor 61 is made of amorphous silicon, microcrystalline oxide semiconductor, amorphous oxide semiconductor, polycrystalline silicon, low-temperature polycrystalline silicon (hereinafter, referred to as LTPS), or gallium nitride (GaN), for example. Examples of the oxide semiconductor include, but are not limited to, IGZO, ZnO, ITZO, etc.

The fourth insulating layer 94 is provided on the third insulating layer 93 to cover the second gate electrode 64B. The source electrode 62 and the drain electrode 63 are provided on the fourth insulating layer 94. The source electrode 62 according to the present embodiment is electrically coupled to the semiconductor 61 through a contact hole H5. The drain electrode 63 is electrically coupled to the semiconductor 61 through a contact hole H3.

A fifth insulating layer 95 is provided on the fourth insulating layer 94 to cover the source electrode 62 and the drain electrode 63. The fifth insulating layer 95 is an organic insulating film and is a planarizing layer that planarizes unevenness formed by the first transistor Tr1 and the various kinds of wiring.

The second transistor Tr2 includes a semiconductor 65, a source electrode 66, a drain electrode 67, a first gate electrode 68A, and a second gate electrode 68B. Detailed explanation of the second transistor Tr2 is omitted because it has a layer structure similar to that of the first transistor Tr1. The drain electrode 67 of the second transistor Tr2 is coupled to coupling wiring 69 through a contact hole H8. The coupling wiring 69 forms holding capacitance CS1 using the third insulating layer 93 provided between the coupling wiring 69 and the semiconductor 61.

While the semiconductor 65, the source electrode 66, the drain electrode 67, the first gate electrode 68A, and the second gate electrode 68B are provided to the same layers as those of the semiconductor 61, the source electrode 62, the drain electrode 63, the first gate electrode 64A, and the second gate electrode 64B, respectively, of the first transistor Tr1, they may be provided to different layers.

The gate line transistor TrG includes a semiconductor 71, a source electrode 72, a drain electrode 73, a first gate electrode 74A, and a second gate electrode 74B. The gate line transistor TrG is a switching element included in the gate driver 12. Detailed explanation of the gate line transistor TrG is omitted because it has a layer structure similar to that of the first transistor Tr1. The layers constituting the gate line transistor TrG may be provided to the same layers as those constituting the first transistor Tr1 or to layers different therefrom.

The light-emitting element 3 is provided on the fifth insulating layer 95 with the sixth insulating layer 96 interposed therebetween. The seventh insulating layer 97 is provided on the sixth insulating layer 96. The first planarizing layer 27 is provided on the seventh insulating layer 97 to cover at least side surfaces 3a of the light-emitting element 3. The light-emitting element 3 has what is called a face-up structure in which an anode terminal 23t is provided at the lower part and a cathode terminal 22t is provided at the upper part. The second coupling electrode 23 is an anode electrode coupled to the anode terminal 23t of the light-emitting element 3. The second coupling electrode 23 is provided on the sixth insulating layer 96 and is coupled to a third coupling electrode 24 through a contact hole H7. The third coupling electrode 24 is provided on the fifth insulating layer 95 and is coupled to the drain electrode 63 through a contact hole H2. As described above, the second coupling electrode 23 and the third coupling electrode 24 couple the anode terminal 23t of the light-emitting element 3 and the drain electrode 63 of the first transistor Tr1. A fourth coupling electrode 25 is provided to the same layer as that of the third coupling electrode 24 and is coupled to the source electrode 62 through a contact hole H4.

The fourth coupling electrode 25 extends on the fifth insulating layer 95 and faces the second coupling electrode 23 with the sixth insulating layer 96 interposed therebetween in the third direction Dz. As a result, capacitance is formed between the second coupling electrode 23 and the fourth coupling electrode 25. The capacitance formed between the second coupling electrode 23 and the fourth coupling electrode 25 is used as holding capacitance of the pixel circuit 28. As described above, the second coupling electrode 23 serves not only as a reflective plate that reflects light but also as an electrode of capacitance CS2.

The cathode terminal 22t of the light-emitting element 3 is exposed from the surface of the first planarizing layer 27. A first coupling electrode 22 is provided on the first planarizing layer 27 and is coupled to the cathode terminals 22t of a plurality of light-emitting elements 3. The first coupling electrode 22 is a cathode electrode coupled to the cathode terminals 22t of the light-emitting elements 3. The first coupling electrode 22 extends from the display region AA to the peripheral region GA. The first coupling electrode 22 is electrically coupled to the cathode wiring 26 at the bottom of a contact hole H1 formed in the first planarizing layer 27 and the fifth insulating layer 95. As a result, the cathodes of the respective light-emitting elements 3 are electrically coupled to the cathode wiring 26 via the first coupling electrode 22.

In the display device 2, the array substrate 20 includes the layers from the substrate 21 to the second coupling electrode 23. The array substrate 20 does not include the first planarizing layer 27, the light-emitting element 3, or the first coupling electrode 22.

As illustrated in FIGS. 3 and 6, the detection device 5 is provided on the display device 2. The detection device 5 includes the sensor substrate 53 and the first electrode 54 provided on the sensor substrate 53. As illustrated in FIG. 6, the sensor substrate 53 and the first electrode 54 are provided facing the first principal surface 21a of the substrate 21 with the light-emitting elements 3 interposed therebetween. The sensor substrate 53 is bonded on the first coupling electrode 22 of the display device 2 with an adhesive layer 99 interposed therebetween. The adhesive layer 99 is an optical clear adhesive (OCA), for example. The sensor substrate 53 is a translucent film-like resin, for example. The sensor substrate 53 may be made of any material deformable by force applied to the input surface IS and may be a glass substrate, for example.

As illustrated in FIG. 7, the first electrode 54 includes a plurality of drive electrodes Tx and a plurality of detection electrodes Rx1. Capacitance is formed between the drive electrodes Tx and the detection electrodes Rx1. The drive electrodes Tx and the detection electrodes Rx1 are provided in a detection region GA of the detection device 5. The detection region GA of the detection device 5 according to the present embodiment overlaps the display region AA of the display device 2. In other words, the drive electrodes Tx and the detection electrodes Rx1 are disposed overlapping the light-emitting elements 3 of the display device 2.

The drive electrodes Tx each include a plurality of first electrode parts 55 and a plurality of first couplers 56. The first electrode parts 55 are arrayed in the first direction Dx in a manner separated from each other. The first electrode parts 55 disposed side by side in the first direction Dx are coupled by the first coupler 56. The drive electrodes Tx extend in the first direction Dx and are arrayed in the second direction Dy.

The detection electrodes Rx1 each include a plurality of second electrode parts 57 and a plurality of second couplers 58. The second electrode parts 57 are arrayed in the second direction Dy in a manner separated from each other. The second electrode parts 57 disposed side by side in the second direction Dy are coupled by the second coupler 58. The detection electrodes Rx1 extend in the second direction Dy and are arrayed in the first direction Dx. The second coupler 58 intersects the first coupler 56 in planar view.

The first electrode parts 55, the second electrode parts 57, the first couplers 56, and the second couplers 58 are made of translucent conductive material, such as indium tin oxide (ITO). At least any one of the first electrode parts 55, the second electrode parts 57, the first couplers 56, and the second couplers 58 may be a plurality of metal thin wires made of metal material or alloy material having the materials described above as a main component. If the first electrode parts 55 and the second electrode parts 57 are made of ITO, for example, they may each have a rectangular tile-like shape. If the first electrode parts 55 and the second electrode parts 57 are made of metal thin wires, they may each have a mesh shape having a plurality of openings.

The drive electrodes Tx and the detection electrodes Rx1 are provided to the same sensor substrate 53. The first electrode parts 55 and the second electrode parts 57 may be provided to different layers with an insulating layer interposed therebetween or to the same layer. If the first electrode parts 55 and the second electrode parts 57 are provided to the same layer, the electrode parts are each coupled by the second coupler 58 and the first coupler 56 formed like bridges with an insulating layer interposed therebetween at the intersection of the second coupler 58 and the first coupler 56.

The drive electrode Tx is coupled to a terminal area 201 by wiring L1. The detection electrode Rx1 is coupled to the terminal area 201 by wiring L2. The terminal area 201 includes a plurality of terminals electrically coupled to a first coupling member 110.

As illustrated in FIG. 8, the first electrode part 55 of the drive electrode Tx is provided overlapping a plurality of pixels Pix. While FIG. 8 illustrates the relation between the drive electrode Tx and the light-emitting elements 3, the explanation with reference to FIG. 8 is also applicable to the configuration of the second electrode part 57 of the detection electrode Rx1. The first electrode part 55 of the drive electrode Tx has a plurality of openings 55a. The openings 55a are each formed at a part overlapping the light-emitting element 3 in the pixel Px. The part not provided with the light-emitting element 3 in the pixel Pix overlaps the drive electrode Tx. With this configuration, light from the light-emitting element 3 passes through the opening 55a and is output from the input surface IS. Consequently, the display apparatus 1 with the detection device can increase the use efficiency of light. While one opening 55a faces the light-emitting elements 3 of a plurality of pixels Pix disposed side by side in FIG. 8, the present embodiment is not limited thereto. Alternatively, different openings may face the respective light-emitting elements 3.

As illustrated in FIG. 7, the detection device 5 includes the second electrode Rx2. The second electrode Rx2 is indicated by an alternate long and two short dashes line in FIG. 7. The second electrode Rx2 is provided over the whole surface of the detection region DA overlapping the drive electrodes Tx and the detection electrodes Rx1. In other words, the second electrode Rx2 is provided in a region overlapping all the light-emitting elements 3 of the display device 2.

As illustrated in FIGS. 3 and 6, the second electrode Rx2 faces the first electrode 54 with the array substrate 20 and the light-emitting elements 3 interposed therebetween. As illustrated in FIG. 6, the second electrode Rx2 is provided on the second principal surface 21b of the substrate 21. A protective layer 98 that protects the second electrode Rx2 is provided on the lower surface of the second electrode Rx2. As a result, capacitance is formed between the second electrode Rx2 and at least one of the drive electrodes Tx and the detection electrodes Rx1. The second electrode Rx2 and at least one of the drive electrodes Tx and the detection electrodes Rx1 serve as the force detector 52 illustrated in FIGS. 1 and 2.

The second electrode Rx2 is provided opposite to the input surface IS across the light-emitting elements 3. With this configuration, the second electrode Rx2 may be made of translucent conductive material, such as ITO, metal material containing Al, Cu, or Ag, for example, or alloy material having these materials as a main component.

The second electrode Rx2 may be a reflection suppression layer that suppresses reflection of light. This configuration can prevent light output from the light-emitting element 3 and reflected by the cover member 100 or the first electrode 54 from being reflected again by the second electrode Rx2. As a result, the display apparatus 1 with the detection device can prevent light output from the light-emitting element 3 from being reflected a plurality of times in the display apparatus 1 with the detection device. Consequently, the display apparatus 1 with the detection device can suppress color mixture of light between the pixels Pix that are disposed side by side and display different colors.

The material of the second electrode Rx2 is metal having high optical density (OD). Examples of the metal having a high OD value include, but are not limited to, molybdenum (Mo), chromium (Cr), tungsten (W), etc. The second electrode Rx2 may be made of alloy material having these metal materials as a main component. Alternatively, the second electrode Rx2 may be made of conductive resin containing carbon particles, such as carbon black and graphite. Still alternatively, the second electrode Rx2 may have a multi-layered structure including metal material containing Al, Cu, or Ag, for example, and a blackened film. Examples of the blackened film include, but are not limited to, oxide of iron (magnetite triiron tetraoxide), complex oxide of Cu and Cr, complex oxide of Cu, Cr, and zinc (Zn), etc.

As illustrated in FIG. 6, the first coupling member 110 is coupled to the sensor substrate 53 and is electrically coupled to the first electrode 54 (the drive electrodes Tx and the detection electrodes Rx1). The first coupling member 110 is a flexible printed circuit board, for example. The first coupling member 110 has a main part 111A and a branch part 111B. The main part 111A is coupled to the first electrode 54 via the terminal area 201. The branch part 111B branches off from the main part 111A and is electrically coupled to the second electrode Rx2. The first coupling member 110 is provided with a detection IC 300 (detection controller 4) by chip-on-film (COF) bonding. The detection IC 300 may be mounted on another control substrate coupled to the first coupling member 110. The first coupling member 110 may be a rigid substrate or a rigid flexible substrate. A second coupling member 211 is coupled to the substrate 21 and is electrically coupled to the drive IC 200. The first coupling member 110 and the second coupling member 211 are electrically coupled.

The touch detection signals Vdet1 detected by the detection device 5 are output from the detection electrodes Rx1 to the detection IC 300 via the first coupling member 110. The force detection signals Vdet2 detected by the detection device 5 are output from the second electrode Rx2 to the detection IC 300 via the first coupling member 110.

The substrate 21 according to the present embodiment is a glass substrate. As illustrated in FIG. 3, the display apparatus 1 with the detection device is incorporated in a housing 210. The housing 210 supports the second principal surface 21b of the substrate 21. This configuration prevents deformation of the substrate 21 when force is applied to the input surface IS.

By contrast, the cover member 100 is a glass substrate or a resin film thinner than the substrate 21. The cover member 100 is more likely to be deformed by force applied to the input surface IS than the substrate 21. The sensor substrate 53 is a film material made of rein, such as acrylic resin, epoxy resin, polyethylene terephthalate (PET), polyethylene naphthalate (PEN), and cycloolefin polymer (COP). These materials are more likely to be deformed than the material (glass) of the substrate 21 when the same force is applied thereto. As a result, the sensor substrate 53 is more likely to be deformed by force applied to the input surface IS than the substrate 21.

The first planarizing layer 27 has lower hardness than the substrate 21. Examples of the material of the first planarizing layer 27 include, but are not limited to, acrylic resin, polysiloxane, polysilazane, epoxy resin, silicone resin, etc. These materials are more likely to be deformed than the material (glass) of the substrate 21 when the same force is applied thereto.

With this configuration, the cover member 100 and the sensor substrate 53 are deformed and curved toward the substrate 21, and the first planarizing layer 27 is elastically deformed at a part to which force is applied on the input surface IS. The amount of deformation of the substrate 21 is smaller than that of the cover member 100, the sensor substrate 53, and the first planarizing layer 27. The distance between the second electrode Rx2 and both the drive electrodes Tx and the detection electrodes Rx1 changes depending on the force applied to the input surface IS. As a result, the capacitance between the second electrode Rx2 and both the drive electrodes Tx and the detection electrodes Rx1 changes. The second electrode Rx2 outputs signals corresponding to the distance between the second electrode Rx2 and both the drive electrodes Tx and the detection electrodes Rx1 as the force detection signals Vdet2. The force detection controller 48 can detect force applied to the input surface IS based on the force detection signals Vdet2. The force detection controller 48 may perform force detection by the mutual capacitive system or the self-capacitive system.

The resistance of the first electrode 54 (the drive electrodes Tx and the detection electrodes Rx1) is 300Ω, for example, and is sufficiently lower than the resistance of the light-emitting element 3 (e.g., approximately $10^{13}\Omega$) when it is turned off (not emitting light). When static electricity enters the input surface IS, it travels in the first electrode 54 because the first electrode 54 is provided closer to the input surface IS with respect to the light-emitting elements 3. The static electricity flows to the power source and the fixed potential, such as GND, via the first coupling member 110 and is discharged. Consequently, the display apparatus 1 with the detection device can prevent static electricity from entering the light-emitting elements 3.

The second electrode Rx2 may be made of metal material having higher conductivity than the substrate 21. When static electricity enters through the second principal surface 21b, it travels in the second electrode Rx2. The static electricity flows to the power source and the fixed potential, such as GND, via the first coupling member 110 and is discharged. With the first electrode 54 and the second electrode Rx2, the display apparatus 1 with the detection device can prevent the light-emitting elements 3 from being damaged by static electricity.

Figure 9:
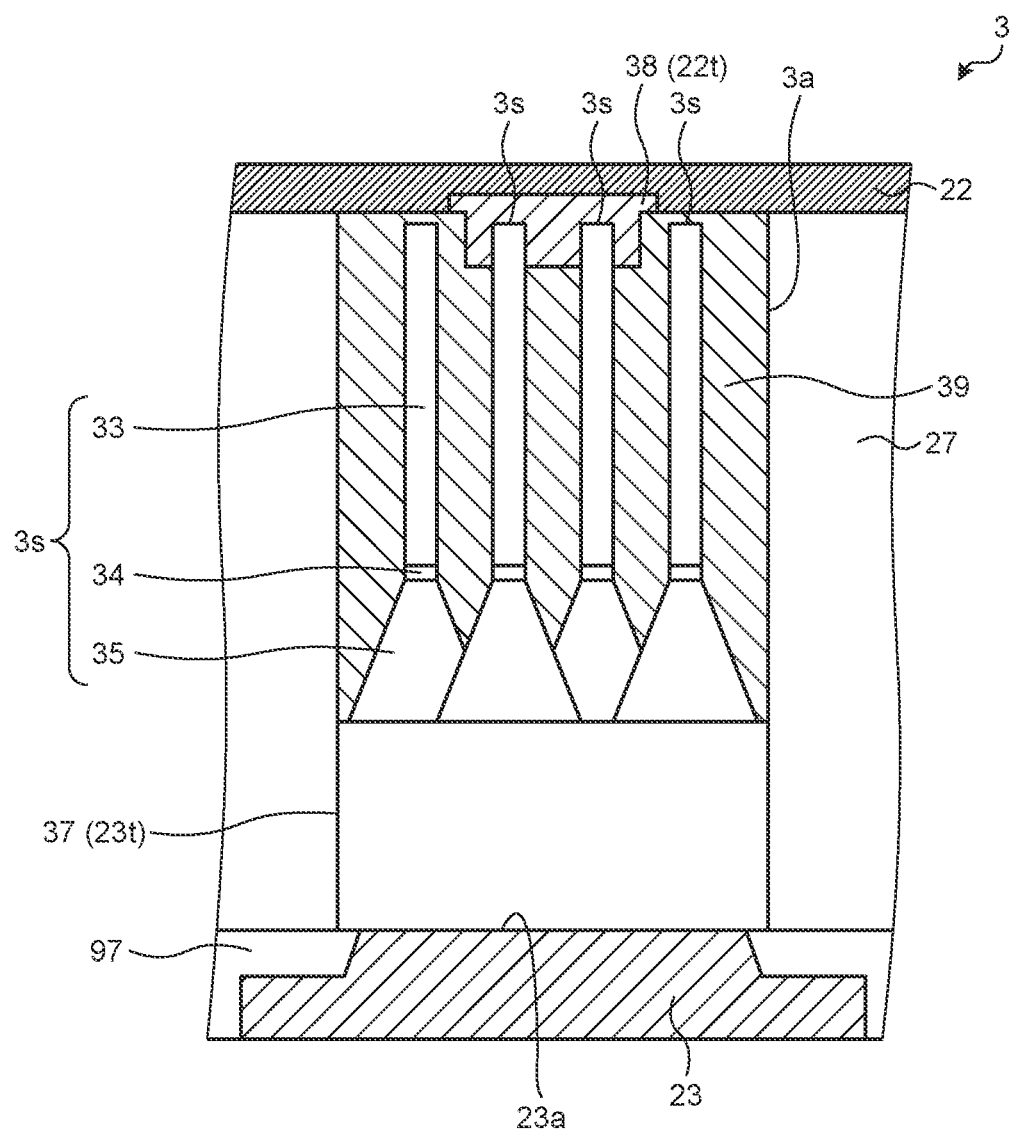
FIG. 9 is a sectional view of the light-emitting element according to the first embodiment.

FIG. 9 is a sectional view of the light-emitting element according to the first embodiment. As illustrated in FIG. 9, the light-emitting element 3 includes a plurality of partial light-emitting elements 3s, a protective layer 39, a p-type electrode 37, and an n-type electrode 38. The protective layer 39 covers the partial light-emitting elements 3s. The partial light-emitting elements 3s have a columnar shape and are provided between the p-type electrode 37 and the n-type electrode 38. The partial light-emitting elements 3s each include an n-type cladding layer 33, an active layer 34, and a p-type cladding layer 35. The n-type electrode 38 is electrically coupled to the n-type cladding layer 33. The p-type electrode 37 is electrically coupled to the p-type cladding layer 35. The p-type cladding layer 35, the active layer 34, and the n-type cladding layer 33 are layered in order on the p-type electrode 37.

The n-type cladding layer 33, the active layer 34, and the p-type cladding layer 35 are light-emitting layers and are made of a compound semiconductor, such as gallium nitride (GaN) and aluminum indium phosphorus (AlInP).

The n-type electrode 38 is made of translucent conductive material, such as ITO. The n-type electrode 38 includes the cathode terminal 22t of the light-emitting element 3 and is coupled to the first coupling electrode 22. The p-type electrode 37 includes the anode terminal 23t of the light-emitting element 3 and includes a Pt layer and a thick Au layer produced by plating. The anode terminal 23t (thick Au layer) is coupled to the second coupling electrode 23 on a placement surface 23a.

The protective layer 39 is a spin on glass (SOG), for example. The side surfaces of the protective layer 39 correspond to the side surfaces 3a of the light-emitting element 3. The first planarizing layer 27 is provided in contact with the side surfaces of the protective layer 39 between the first coupling electrode 22 and the seventh insulating layer 97. The configuration of the light-emitting element 3 illustrated in FIG. 9 is given by way of example only, and the light-emitting element 3 may have what is called a face-down structure, for example.

Figure 10:
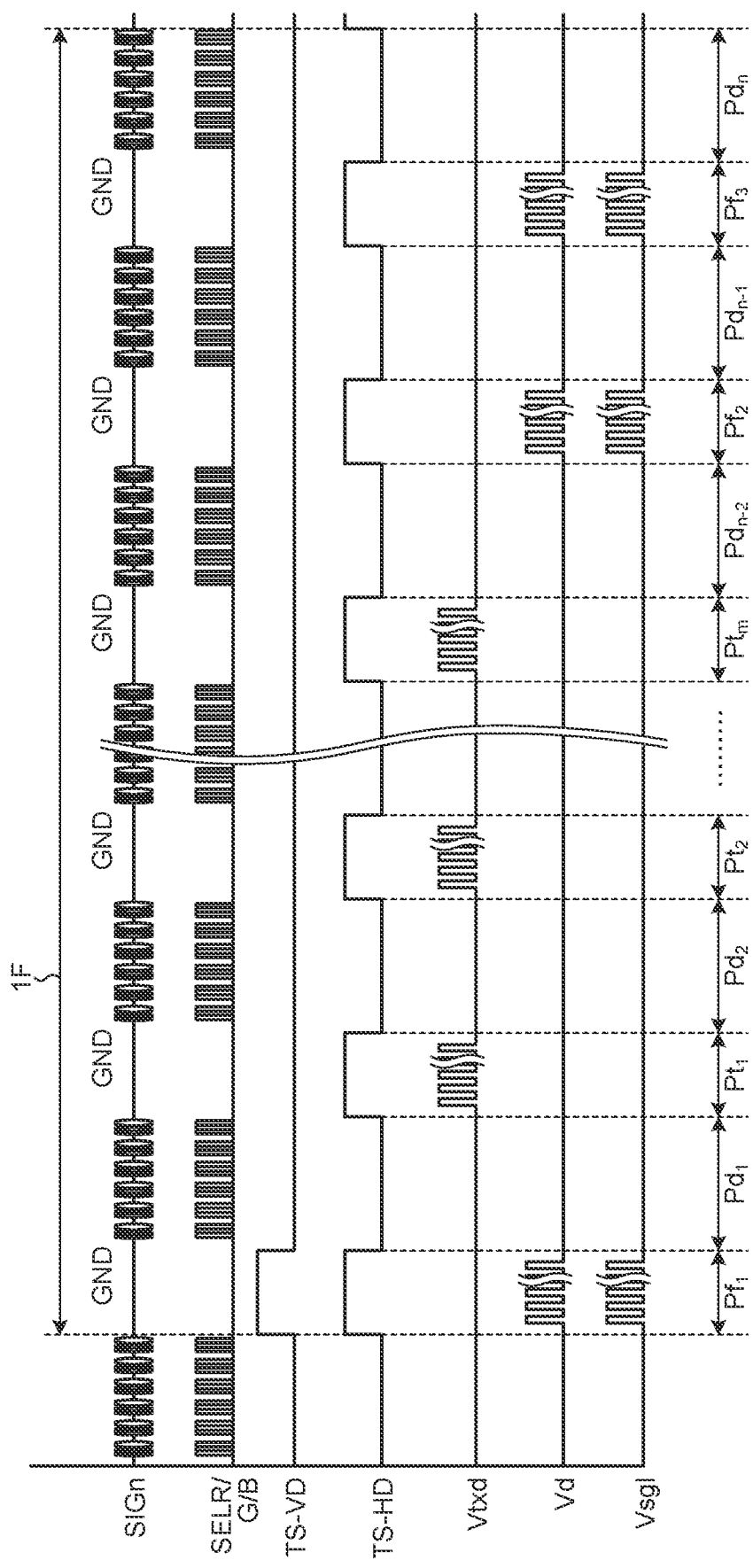
FIG. 10 is a timing waveform chart of exemplary operations of the display apparatus with the detection device according to the first embodiment.

FIG. 10 is a timing waveform chart of exemplary operations of the display apparatus with the detection device according to the first embodiment. FIG. 10 illustrates a case where display by the display device 2 and touch detection and force detection by the detection device 5 are synchronously performed as exemplary operations of the display apparatus 1 with the detection device. As illustrated in FIG. 10, the display apparatus 1 with the detection device performs display, touch detection, and force detection by dividing these operations into a plurality of sections in one frame period 1F of the display device 2, that is, a time required to display video information of one screen. The display apparatus 1 with the detection device performs display periods, touch detection periods, and force detection periods in a time-division manner. The display apparatus 1 with the detection device may perform display, touch detection, and force detection in any division manner.

When a control signal TS-VD is turned on (high level voltage), one frame period 1F is started. A control signal TS-HD is repeatedly turned on (high level voltage) and off (low level voltage) in one frame period (1F). In a period when the control signal TS-HD is turned on, touch detection or force detection is performed. In a period when the control signal TS-HD is turned off, display is performed.

One frame period 1F includes a plurality of display periods $Pd_N$ (N=1, 2, . . . , n), a plurality of touch detection periods $Pt_M$ (M=1, 2, . . . , m), and a plurality of force detection periods $Pf_1$, $Pf_2$, and $Pf_3$. These periods are alternately arranged on a time axis like the force detection period $Pf_1$, the display period $Pd_1$, the touch detection period $Pt_1$, the display period $Pd_2$, the touch detection period $Pt_2$, the display period $Pd_3$, . . . .

The display controller 11 supplies the pixels signals Vpix to the pixels Pix (refer to FIG. 4) selected in each display period $Pd_N$ via the gate driver 12 and the source driver 13. FIG. 10 illustrates selection signals SELR/G/B for selecting the three colors of RGB and image signals SIGn for the respective colors. The corresponding pixels Pix are selected based on the selection signals SELR/G/B, and the image signals SIGn for the respective colors are supplied to the selected pixels Pix. An image obtained by dividing the video signals Vdisp of one screen into n pieces is displayed in each display period $Pd_N$, and video information of one screen is displayed through the display periods $Pd_1$, $Pd_2$, . . . , $Pd_n$. In the display period $Pd_N$, the drive electrodes Tx and the detection electrodes Rx1 of the detection device 5 are not supplied with signals, such as the touch drive signals Vtxd, and are coupled to the ground potential, for example. Alternatively, the drive electrodes Tx and the detection electrodes Rx1 may be in a floating state where no voltage signal is supplied thereto and their electric potential is not fixed.

In the touch detection period $Pt_M$, the touch detection controller 40 outputs the control signals to the first drive electrode driver 14. The first drive electrode driver 14 supplies the touch drive signals Vtxd to the drive electrodes Tx. Capacitance between the drive electrodes Tx and the detection electrodes Rx1 changes due to contact or proximity of the object to be detected OBJ with or to the input surface IS. The detection electrodes Rx1 output the touch detection signals Vdet1 corresponding to the change in capacitance between the drive electrodes Tx and the detection electrodes Rx1.

The following describes a case where the detection device 5 performs force detection by the self-capacitive system. In the force detection periods $Pf_1$, $Pf_2$, and $Pf_3$, the force detection controller 48 outputs the control signals to the second drive electrode driver 15. The second drive electrode driver 15 supplies the second drive signals Vd to the second electrode Rx2. The second electrode Rx2 outputs the force detection signals Vdet2 corresponding to the change in capacitance between the drive electrodes Tx and the second electrode Rx2. The force detection controller 48 performs arithmetic processing for calculating force input to the input surface IS based on the force detection signals Vdet2 supplied from the second electrode Rx2. In the force detection periods $Pf_1$, $Pf_2$, and $Pf_3$, the second drive electrode driver 15 supplies guard signals Vsg1 to the detection electrodes Rx1. While the guard signal Vsg1 preferably has a waveform having the same amplitude and the same frequency as those of the second drive signal Vd, it may have different amplitude.

The detection device 5 may perform force detection by the mutual capacitive system. To perform force detection by the mutual capacitive system, the force detection controller 48 outputs the control signals to the second drive electrode driver 15 in the force detection periods $Pf_1$, $Pf_2$, and $Pf_3$. The second drive electrode driver 15 supplies the second drive signals Vd to the drive electrodes Tx. The second electrode Rx2 outputs the force detection signals Vdet2 corresponding to the change in capacitance between the drive electrodes Tx and the second electrode Rx2 based on the mutual capacitive system. In the force detection periods $Pf_1$, $Pf_2$, and $Pf_3$, the second drive electrode driver 15 supplies the guard signals Vsg1 to the detection electrodes Rx1 not supplied with the second drive signals Vd out of the drive electrodes Tx and the detection electrodes Rx1. This mechanism can prevent capacitive coupling between the drive electrodes Tx and the detection electrodes Rx1. Alternatively, the second drive electrode driver 15 may supply the second drive signals Vd to the detection electrodes Rx1 and supply the guard signals Vsg1 to the drive electrodes Tx.

The display apparatus 1 with the detection device may asynchronously perform display by the display device 2 and touch detection and force detection by the detection device 5. In the asynchronous operation, the detection device 5 can perform detection in the same period as the period when the display device 2 performs display. In this case, the detection device 5 may perform touch detection and force detection in a time-division manner.

First Modification

Figure 11:
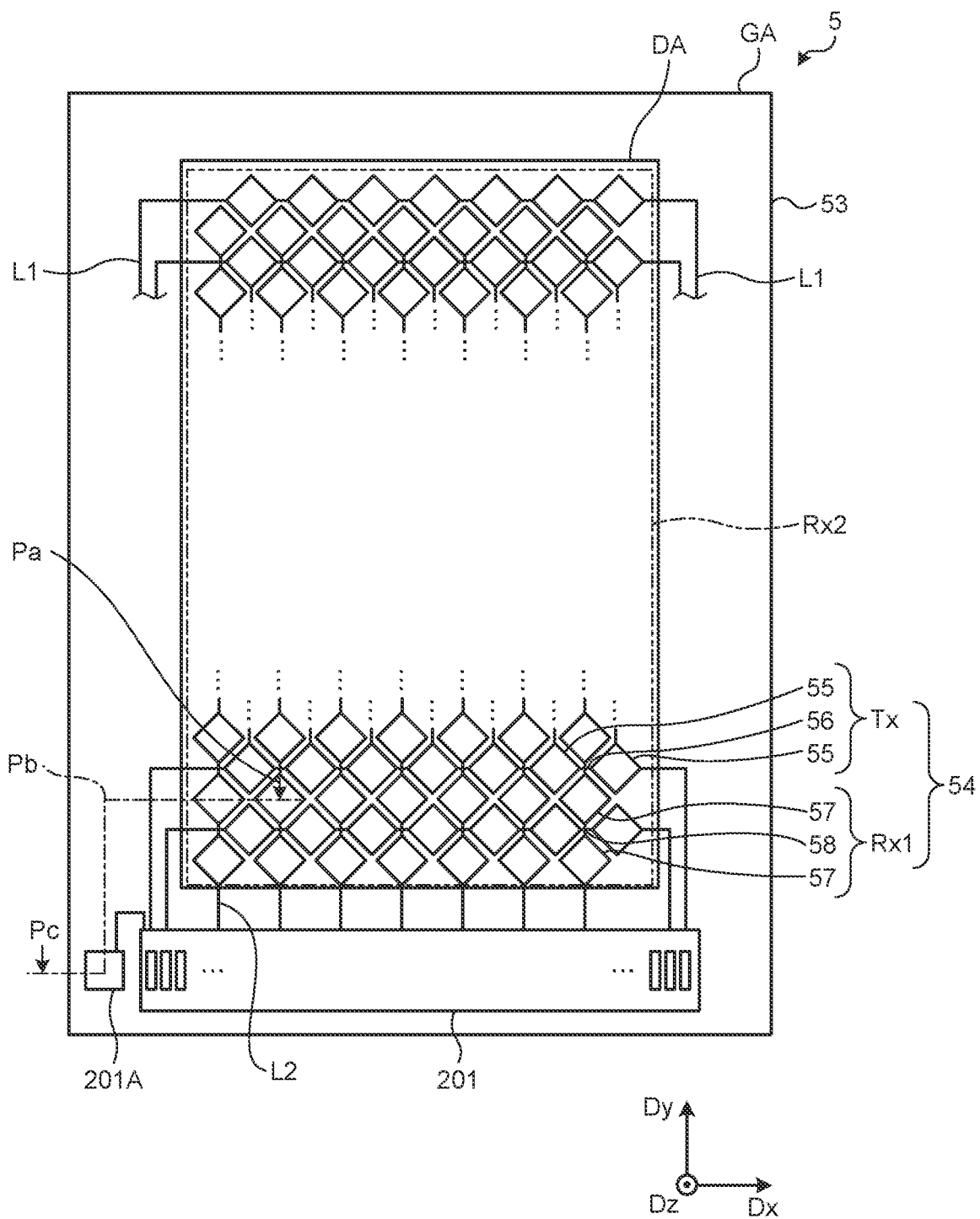
FIG. 11 is a plan view schematically illustrating the detection device according to a first modification of the first embodiment.
Figure 12:
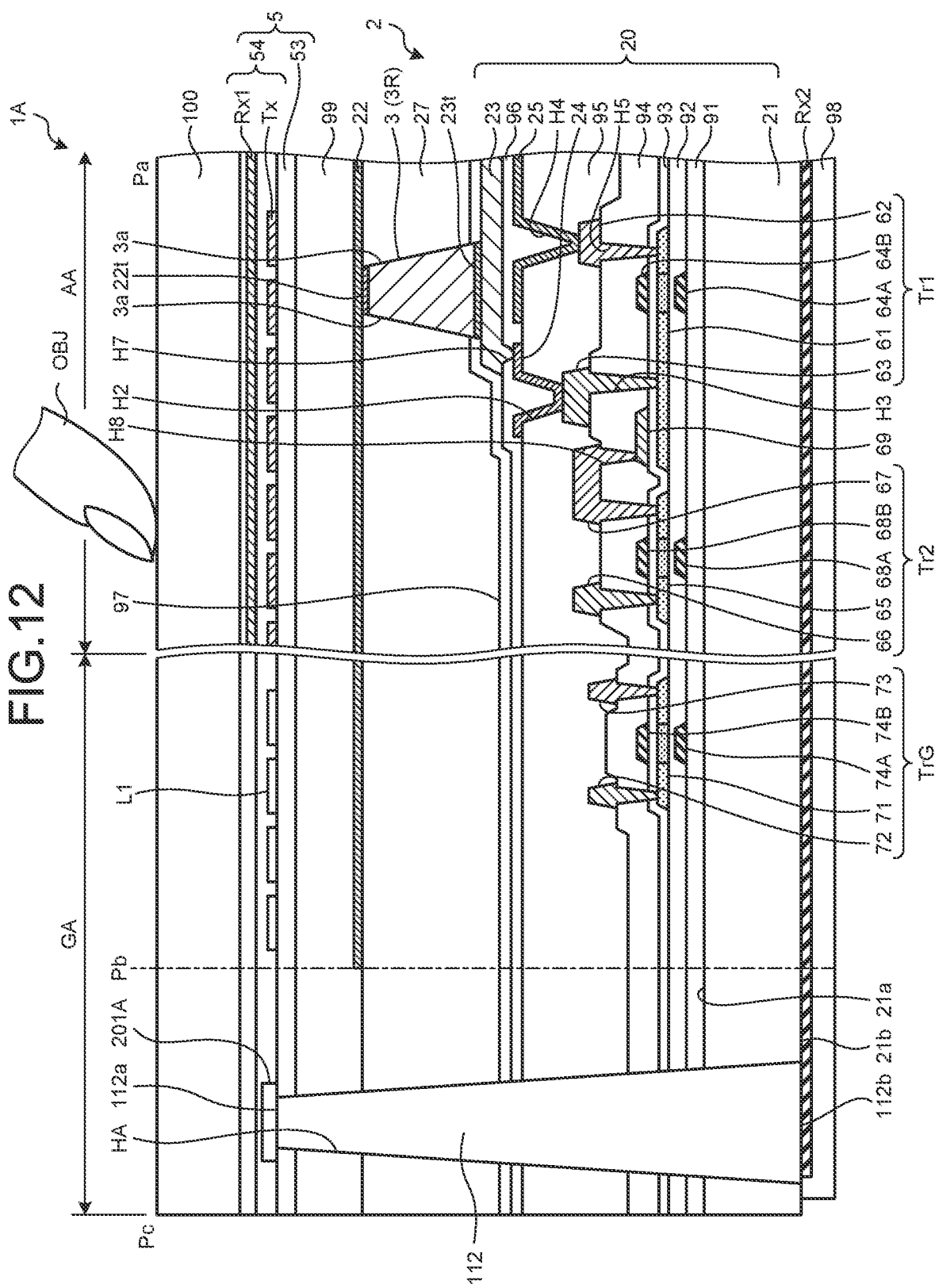
FIG. 12 is a sectional view of a schematic sectional structure of the display apparatus with the detection device according to the first modification of the first embodiment.

FIG. 11 is a plan view schematically illustrating the detection device according to a first modification of the first embodiment. FIG. 12 is a sectional view of a schematic sectional structure of the display apparatus with the detection device according to the first modification of the first embodiment. In the description below, the components described in the embodiment above are denoted by like reference numerals, and explanation thereof is omitted.

As illustrated in FIG. 11, a coupling terminal 201A is provided in the peripheral region GA of the sensor substrate 53. The coupling terminal 201A is electrically coupled to the terminal area 201. As illustrated in FIG. 12, a display apparatus 1A with the detection device has a through hole HA passing through the display device 2. The through hole HA is formed in the peripheral region GA and passes through the substrate 21, the insulating layers, the first planarizing layer 27, the adhesive layer 99, and the sensor substrate 53.

The through hole HA can be formed by irradiation with laser light from below the second principal surface 21b of the substrate 21. The laser light source is a device that can perform laser drilling on glass or organic material and is a carbon dioxide gas laser device or an excimer laser device, for example. The through hole HA may be formed not only by irradiation with laser light but also by appropriately performing other processes, such as etching.

A conductor 112 is provided in the through hole HA. The upper part of the conductor 112 is in contact with the coupling terminal 201A, the lower part of the conductor 112 is in contact with the second electrode Rx2. The conductor 112 is made of highly conductive metal material, such as Cu and Ag, or alloy material having these metal materials as a main component. With this configuration, the second electrode Rx2 is electrically coupled to the first coupling member 110 by the coupling terminal 201A, the through hole HA, and the conductor 112. The display apparatus 1A with the detection device according to the present modification includes the first coupling member 110 having a simpler structure and can be manufactured without requiring the process for coupling the branch part 111B of the first coupling member 110 and the second electrode Rx2. In other words, the display apparatus 1A with the detection device does not require the branch part 111B of the first coupling member 110 covering the side surface of the substrate 21 in the second direction Dy. As a result, the display apparatus 1A with the detection device can be downsized in the second direction Dy. Compared with a case where the first electrode 54 and the second electrode Rx2 are provided with the respective first coupling members 110, the display apparatus 1A with the detection device can prevent the first coupling members 110 from coming into contact with each other. Consequently, the display apparatus 1A with the detection device requires a smaller space for housing the first coupling member 110 therein.

The through hole HA is not necessarily filled up with the conductor 112. The conductor 112 may be provided at least along the inner circumferential surface of the through hole HA in the thickness direction in an electrically connectable manner.

Second Modification

Figure 13:
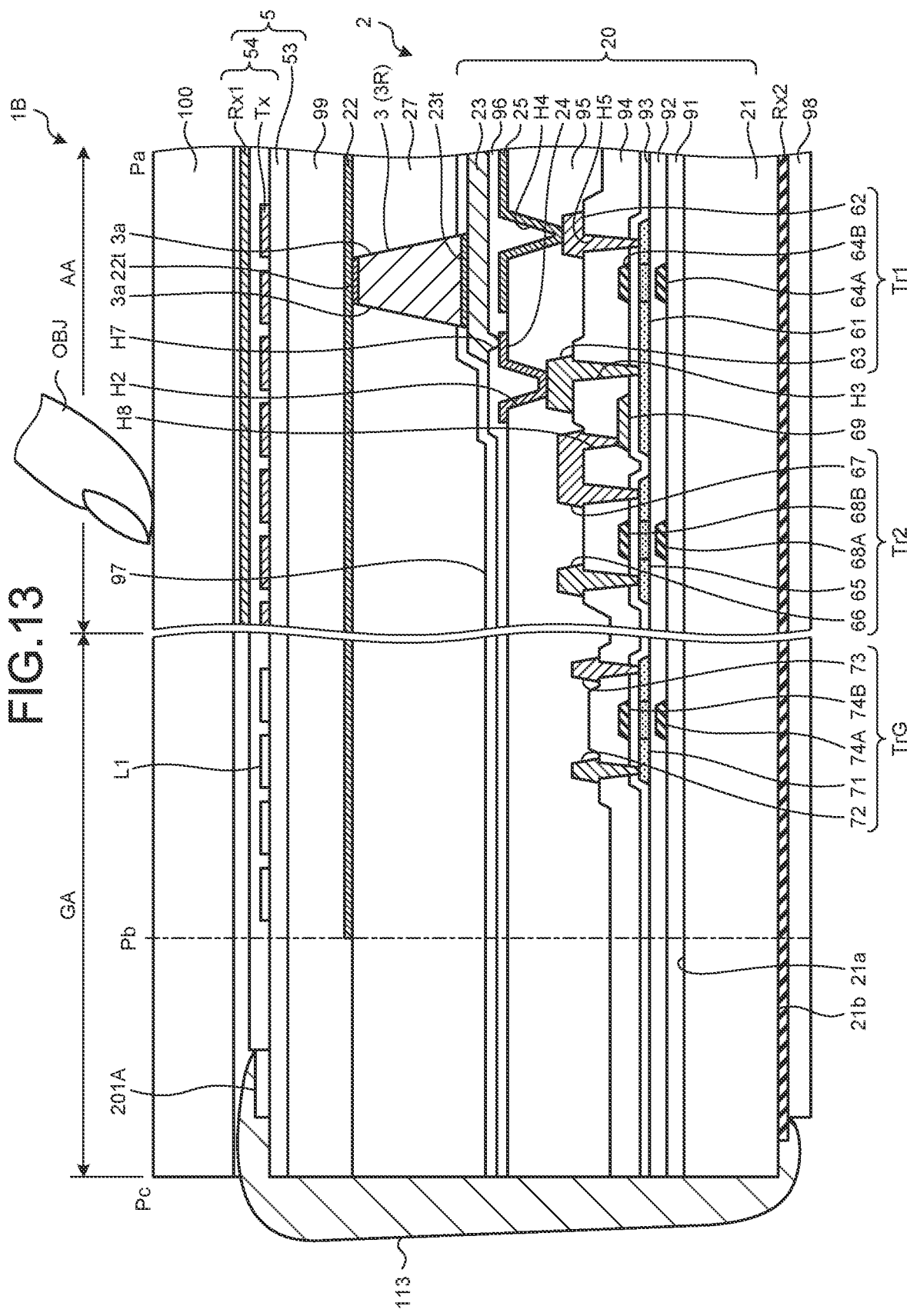
FIG. 13 is a sectional view of a schematic sectional structure of the display apparatus with the detection device according to a second modification of the first embodiment.

FIG. 13 is a sectional view of a schematic sectional structure of the display apparatus with the detection device according to a second modification of the first embodiment. Similarly to the configuration illustrated in FIG. 11, a display apparatus 1B with the detection device includes the coupling terminal 201A in the peripheral region GA of the sensor substrate 53. As illustrated in FIG. 13, the display apparatus 1B with the detection device includes a conductor 113 provided to the side surface of the display device 2. The conductor 113 covers the end of the second principal surface 21b of the substrate 21 and is electrically coupled to the second electrode Rx2. The conductor 113 is provided to the side surfaces of the substrate 21, the insulating layers, the first planarizing layer 27, the adhesive layer 99, and the sensor substrate 53 and is electrically coupled to the coupling terminal 201A.

The conductor 113 can be made of a conductive paste containing metal material, such as Cu and Ag. The conductor 113 can be applied and formed using a dispenser, for example. The dispenser or the like discharges the conductive paste, thereby forming the conductor 113 along the side surface of the display device 2. The display apparatus 1B with the detection device can be manufactured at a lower cost without requiring the processing for boring the through hole HA in the substrate 21 compared with the first modification.

Third Modification

Figure 14:
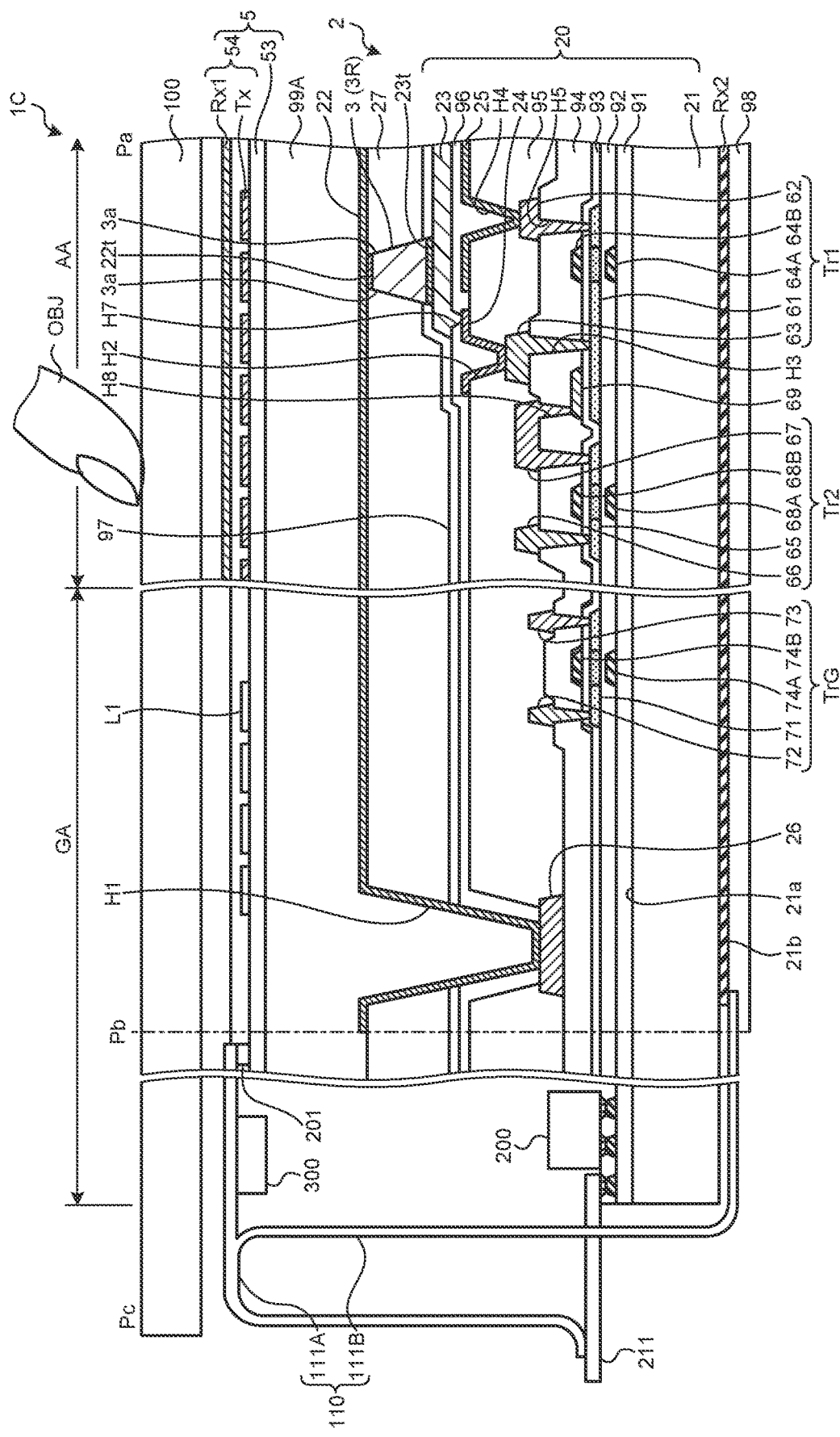
FIG. 14 is a sectional view of a schematic sectional structure of the display apparatus with the detection device according to a third modification of the first embodiment.

FIG. 14 is a sectional view of a schematic sectional structure of the display apparatus with the detection device according to a third modification of the first embodiment. A display apparatus 1C with the detection device includes a second planarizing layer 99A. The second planarizing layer 99A is provided on the first coupling electrode 22. In other words, the second planarizing layer 99A is provided between the first planarizing layer 27 and the sensor substrate 53 and covers the upper surface of the light-emitting element 3. The second planarizing layer 99A is made of resin material more likely to be deformed than the first planarizing layer 27 when force is applied to the input surface IS. If the elastic modulus of the first planarizing layer 27 is approximately 20 MPa, for example, the second planarizing layer 99A has an elastic modulus of approximately 200 MPa.

Providing a plurality of resin layers between the first electrode 54, the substrate 21, and the second electrode Rx2 makes the members, such as the cover member 100, the first electrode 54, and the sensor substrate 53, more likely to be deformed by force applied to the input surface IS. Consequently, the display apparatus 1C with the detection device can perform force detection with higher accuracy.

Fourth Modification

Figure 15:
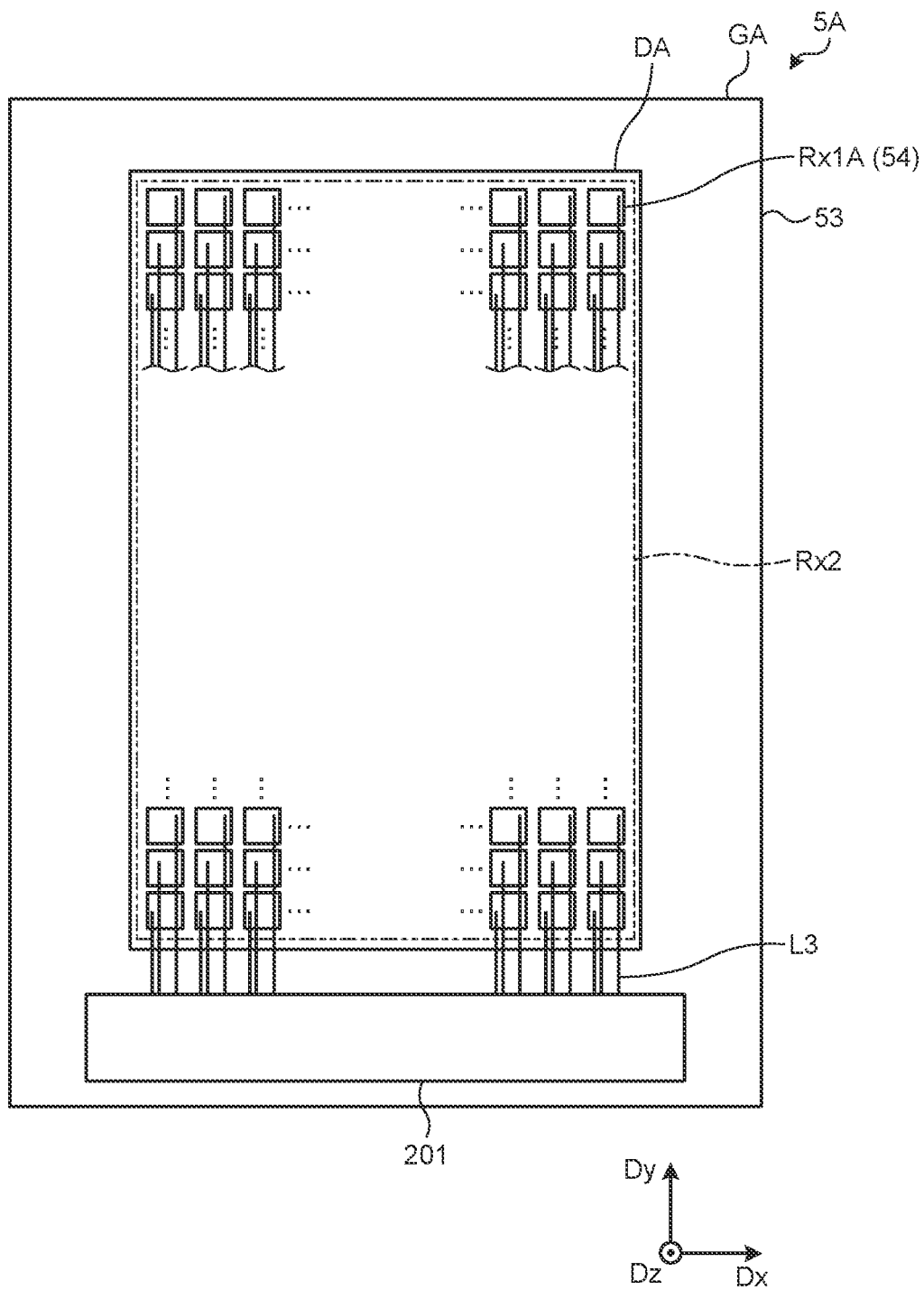
FIG. 15 is a plan view schematically illustrating the detection device according to a fourth modification of the first embodiment.

FIG. 15 is a plan view schematically illustrating the detection device according to a fourth modification of the first embodiment. In a detection device 5A according to the present modification, a plurality of detection electrodes Rx1A are disposed in a matrix (row-column configuration) in the detection region DA. The detection electrodes Rx1A also serve as the drive electrodes Tx. The detection electrodes Rx1A are each electrically coupled to the terminal area 201 via wiring L3.

The detection device 5A according to the present modification performs touch detection by the self-capacitive system. In other words, the first drive electrode driver 14 supplies the touch drive signals Vtxd to the detection electrodes Rx1A in the touch detection period $Pt_M$. The detection electrodes Rx1A have a change in capacitance by the presence of the object to be detected OBJ in contact with or in proximity to the input surface IS. The detection electrodes Rx1A output the touch detection signals Vdet1 corresponding to the change in capacitance.

To perform force detection by the mutual capacitive system, the second drive electrode driver 15 supplies the second drive signals Vd to the detection electrodes Rx1A similarly to the operations described with reference to FIG. 10. The second electrode Rx2 outputs the force detection signals Vdet2 corresponding to the change in capacitance between the detection electrodes Rx1A and the second electrode Rx2 based on the mutual capacitive system. In the force detection periods $Pf_1$, $Pf_2$, and $Pf_3$, the second drive electrode driver 15 may supply the guard signals Vsg1 to the detection electrodes Rx1A not supplied with the second drive signals Vd out of the detection electrodes Rx1.

Second Embodiment

Figure 16:
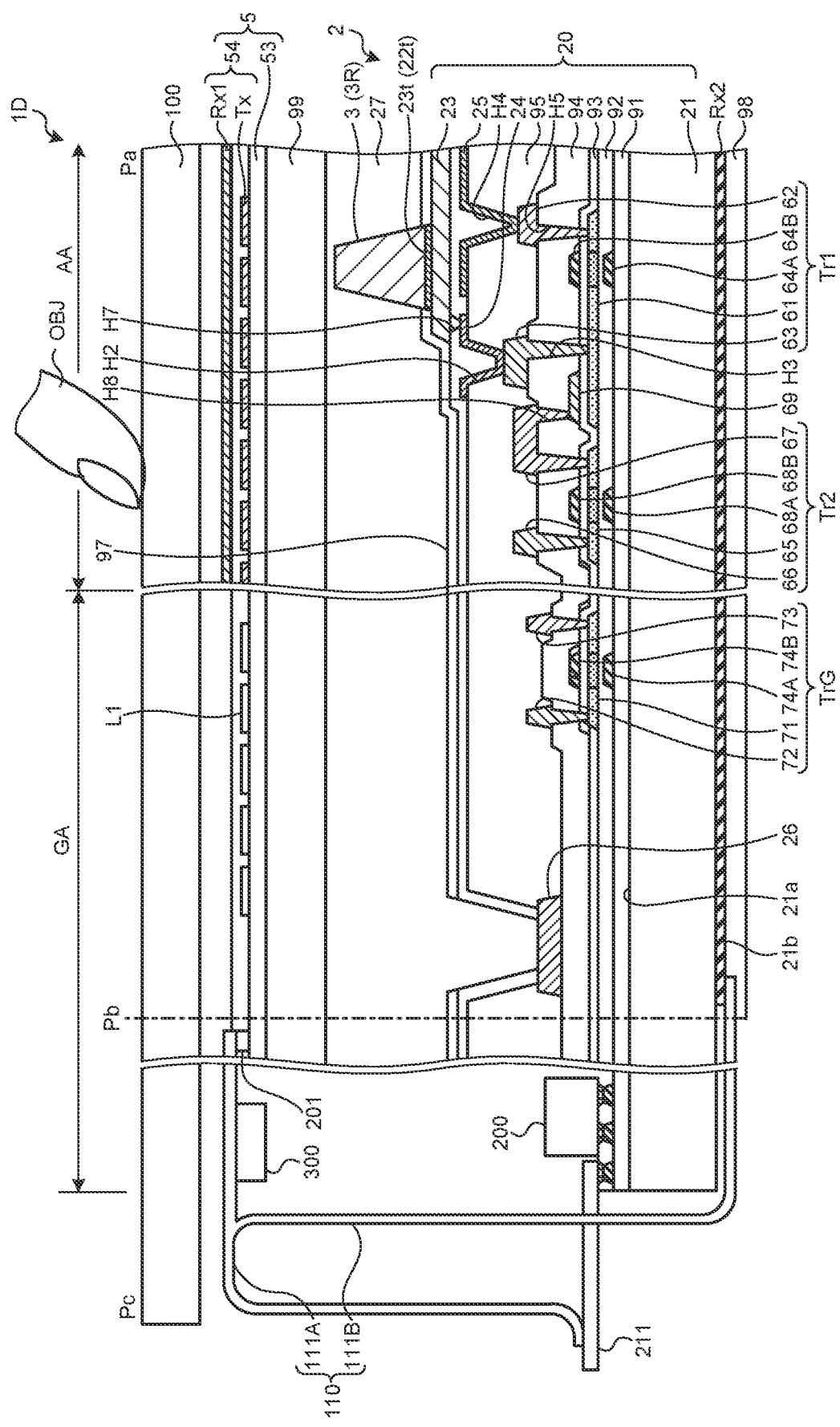
FIG. 16 is a sectional view of a schematic sectional structure of the display apparatus with the detection device according to a second embodiment.
Figure 17:
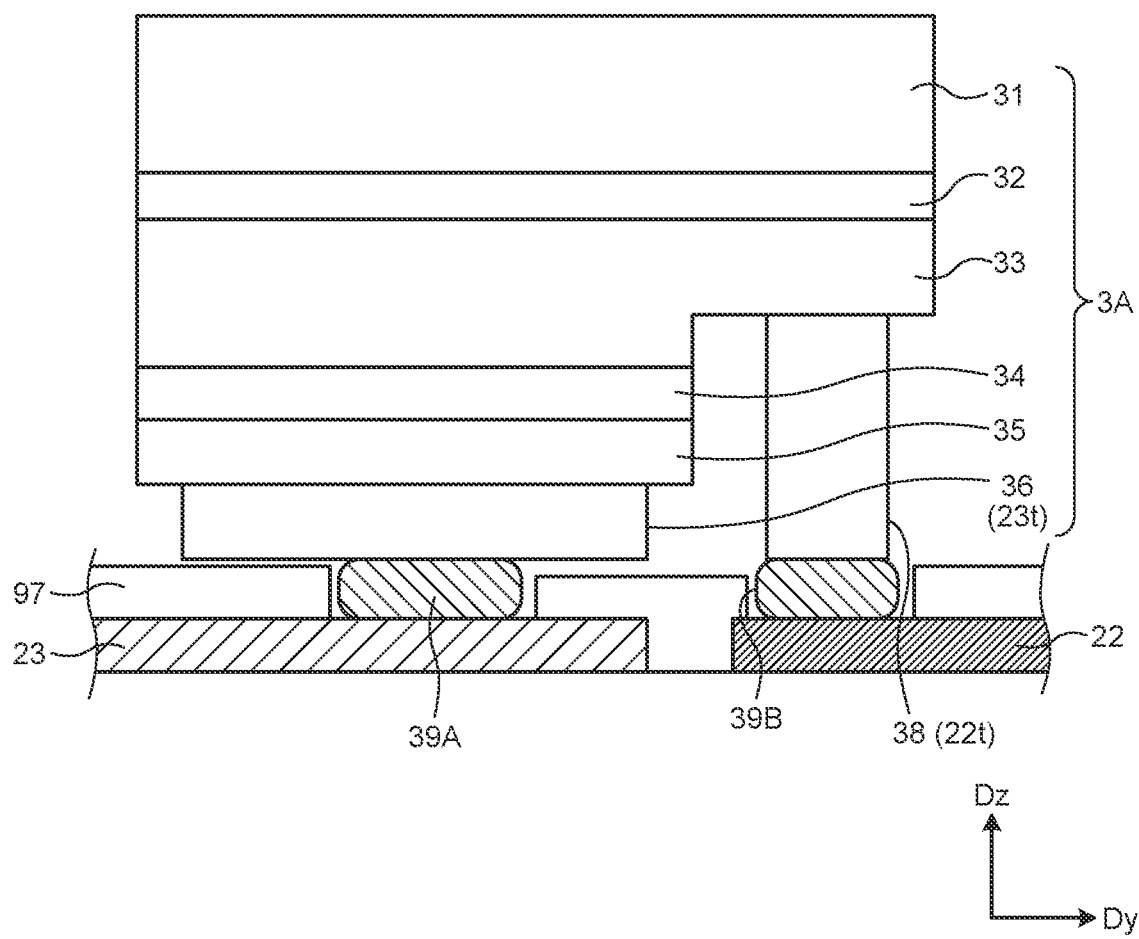
FIG. 17 is a sectional view of the light-emitting element according to the second embodiment.

FIG. 16 is a sectional view of a schematic sectional structure of the display apparatus with the detection device according to a second embodiment. FIG. 17 is a sectional view of the light-emitting element according to the second embodiment. In a display apparatus 1D with the detection device according to the present embodiment, a light-emitting element 3A has what is called a face-down structure. In other words, the anode terminal 23t and the cathode terminal 22t of the light-emitting element 3A are provided on the substrate 21. As illustrated in FIG. 16, the first coupling electrode 22 and the second coupling electrode 23 are provided between the substrate 21 and the light-emitting element 3A. The first coupling electrode 22 is coupled to the cathode terminal 22t of the light-emitting element 3A. The first coupling electrode 22 is electrically coupled to the cathode wiring 26 via wiring provided on the sixth insulating layer 96. The second coupling electrode 23 is coupled to the anode terminal 23t of the light-emitting element 3A. The first planarizing layer 27 is provided on the seventh insulating layer 97 to cover the side surfaces 3a and the upper surface of the light-emitting element 3A.

In the light-emitting element 3A, as illustrated in FIG. 17, a buffer layer 32, an n-type cladding layer 33, an active layer 34, a p-type cladding layer 35, and a p-type electrode 36 are layered in order on a translucent substrate 31. In the light-emitting element 3A, the translucent substrate 31 is provided on the upper side, and the p-type electrode 36 is provided on the lower side. The surface of the n-type cladding layer 33 facing a first coupling electrode 22 has a region exposed from the active layer 34. This region is provided with an n-type electrode 38.

The p-type electrode 36 is made of material having metallic luster that reflects light from the light-emitting layer. The p-type electrode 36 includes the anode terminal 23t and is coupled to the second coupling electrode 23 serving as the anode electrode with a bump 39A interposed therebetween. The n-type electrode 38 includes the cathode terminal 22t and is coupled to the first coupling electrode 22 serving as the cathode electrode with a bump 39B interposed therebetween. In the light-emitting element 3A, the p-type cladding layer 35 and the n-type cladding layer 33 are not directly bonded, and another layer (light-emitting layer (active layer 34)) is provided therebetween. With this configuration, carriers, such as electrons and holes, can be concentrated in the light-emitting layer, thereby efficiently recombining the carriers (emitting light). The light-emitting layer may have a multi-quantum well structure (MQW structure) in which well layers and barrier layers composed of several atomic layers are cyclically layered for higher efficiency. The display apparatus 1D with the detection device including the light-emitting element 3A having the face-down structure can satisfactorily perform force detection similarly to the first embodiment.

Third Embodiment

Figure 18:
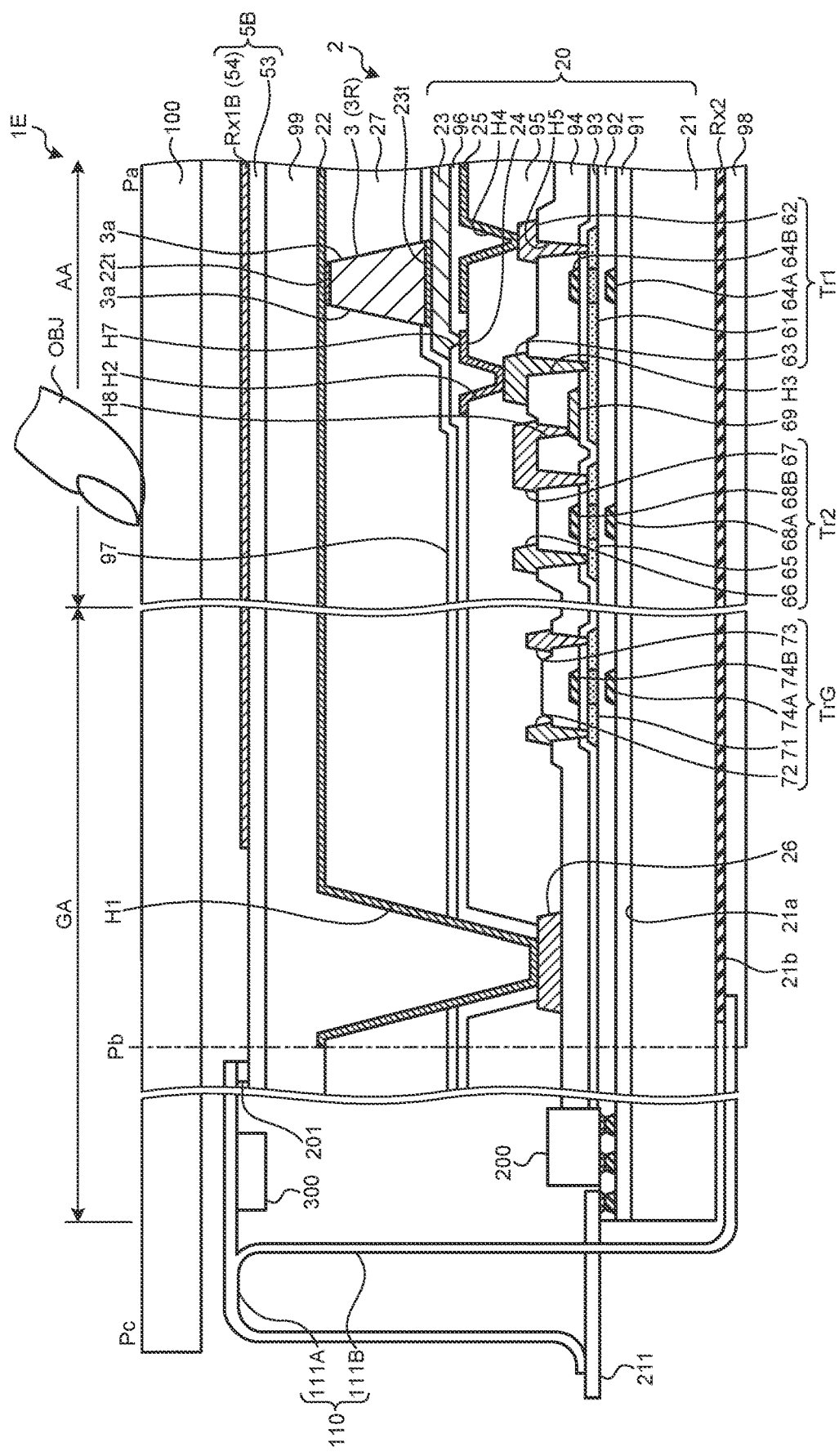
FIG. 18 is a sectional view of a schematic sectional structure of the display apparatus with the detection device according to a third embodiment.

FIG. 18 is a sectional view of a schematic sectional structure of the display apparatus with the detection device according to a third embodiment. In a display apparatus 1E with the detection device according to the present embodiment, the detection device 5 includes the sensor substrate 53 and a detection electrode Rx1B provided to the sensor substrate 53 as illustrated in FIG. 18. The detection device 5 includes the detection electrode Rx1B alone as the first electrode 54 and does not include the drive electrodes Tx. The detection electrode Rx1B is continuously provided over the whole surface of the detection region DA. In this case, the detection device 5 does not perform touch detection, and the display apparatus 1E with the detection device does not necessarily include the touch detection controller 40. As illustrated in FIG. 8, the first electrode 54 may have the openings 55a in the regions facing the light-emitting elements 3.

The detection electrode Rx1B is provided facing the second electrode Rx2 with the array substrate 20, the light-emitting elements 3, and the first planarizing layer 27 interposed therebetween. With this configuration, a detection device 5B can perform at least force detection similarly to the examples described above. The display apparatus 1E with the detection device can be used for wearable devices and smartwatches, for example.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the technical scope of the disclosure. At least one of various omissions, substitutions, and changes of the components may be made without departing from the gist of the embodiments above and the modifications thereof.

What is claimed is:

1. A display apparatus with a detection device comprising:
a substrate having a first principal surface and a second principal surface opposite to the first principal surface;
a plurality of inorganic light-emitting elements provided on the first principal surface in a display region of the substrate;
a first electrode facing the first principal surface of the substrate with the inorganic light-emitting elements interposed between the first electrode and the first principal surface;
a first planarizing layer provided between the substrate and the first electrode and covering at least a side surface of the inorganic light-emitting elements; and
a second electrode facing the second principal surface of the substrate and configured to output a signal corresponding to a change in distance between the second electrode and the first electrode.

2. The display apparatus with the detection device according to claim 1, wherein the first planarizing layer is made of material having lower hardness than the substrate and is capable of being deformed by force applied to an input surface.

3. The display apparatus with the detection device according to claim 1, further comprising:
a sensor substrate facing the first principal surface of the substrate and provided with the first electrode; and
a coupling member coupled to the sensor substrate and electrically coupled to the first electrode.

4. The display apparatus with the detection device according to claim 3, wherein the coupling member has a main part coupled to the first electrode and a branch part branching off from the main part and electrically coupled to the second electrode.

5. The display apparatus with the detection device according to claim 3, further comprising:
a through hole formed in a peripheral region outside the display region and passing through the substrate and the first planarizing layer; and
a conductor provided in the through hole and configured to electrically couple the second electrode and the coupling member.

6. The display apparatus with the detection device according to claim 3, further comprising a conductor provided to the second principal surface and a side surface of the substrate and configured to electrically couple the second electrode and the coupling member.

7. The display apparatus with the detection device according to claim 1, wherein the second electrode is a reflection suppression layer that suppresses reflection of light.

8. The display apparatus with the detection device according to claim 1, further comprising a second planarizing layer provided between the first planarizing layer and the first electrode and covering an upper surface of the inorganic light-emitting elements.

9. The display apparatus with the detection device according to claim 1, wherein
the first electrode comprises a plurality of drive electrodes and a plurality of detection electrodes, and
the detection electrodes output a signal corresponding to capacitance between the drive electrodes and the detection electrodes.

10. The display apparatus with the detection device according to claim 1, wherein the first electrode has an opening at a part overlapping the inorganic light-emitting elements.

11. The display apparatus with the detection device according to claim 1, wherein the second electrode is provided over the whole surface of a region overlapping the display region of the substrate.

12. The display apparatus with the detection device according to claim 1, further comprising:
a first coupling electrode coupled to a cathode terminal of the inorganic light-emitting elements; and
a second coupling electrode coupled to an anode terminal of the inorganic light-emitting elements, wherein
the first coupling electrode and the second coupling electrode are provided between the substrate and the inorganic light-emitting elements.

13. The display apparatus with the detection device according to claim 1, further comprising:
a first coupling electrode coupled to a cathode terminal of the inorganic light-emitting elements; and
a second coupling electrode coupled to an anode terminal of the inorganic light-emitting elements, wherein
the first coupling electrode is provided on the inorganic light-emitting elements and the first planarizing layer, and
the second coupling electrode is provided between the substrate and the inorganic light-emitting elements.

* * * * *